(12) United States Patent
Grimm et al.

(10) Patent No.: US 8,646,701 B2
(45) Date of Patent: Feb. 11, 2014

(54) MOLDABLE HOUSING DESIGN FOR SYNTHETIC JET EJECTOR

(75) Inventors: Daniel N. Grimm, Round Rock, TX (US); Ronald Lutz, Round Rock, TX (US)

(73) Assignee: Nuventix, Inc., Austin, TX (US)

( * ) Notice: Subject to any disclaimer, the term of this patent is extended or adjusted under 35 U.S.C. 154(b) by 1455 days.

(21) Appl. No.: 11/825,158

(22) Filed: Jul. 3, 2007

(65) Prior Publication Data

US 2008/0009187 A1 Jan. 10, 2008

Related U.S. Application Data

(60) Provisional application No. 60/818,717, filed on Jul. 5, 2006.

(51) Int. Cl.
*B05B 1/08* (2006.01)
*B05B 1/00* (2006.01)

(52) U.S. Cl.
USPC .............. 239/102.2; 239/102.1; 239/600; 165/908

(58) Field of Classification Search
USPC ............ 239/330, 4, 331, 102.1, 102.2, 589, 239/592, 593, 596, 597, 600, 601; 165/109.1, 908; 347/86; 264/275, 264/279.1
See application file for complete search history.

(56) References Cited

U.S. PATENT DOCUMENTS

| 4,253,609 | A  | * | 3/1981  | Laauwe ........................ 239/327 |
| 6,181,572 | B1 | * | 1/2001  | Lutz, Jr. ........................ 361/800 |
| 6,247,525 | B1 | * | 6/2001  | Smith et al. ............. 165/104.25 |
| 6,333,852 | B1 | * | 12/2001 | Lin .............................. 361/697 |
| 6,631,077 | B2 | * | 10/2003 | Zuo .............................. 361/699 |
| 6,758,837 | B2 | * | 7/2004  | Peclat et al. .................. 604/295 |
| 6,759,159 | B1 | * | 7/2004  | Gray et al. ..................... 429/71 |
| 6,988,706 | B2 | * | 1/2006  | Seeley et al. ............. 251/129.06 |
| 7,252,140 | B2 | * | 8/2007  | Glezer et al. ................. 165/80.3 |
| 2006/0281398 | A1 | * | 12/2006 | Yokomizo et al. ............ 454/184 |

OTHER PUBLICATIONS

Luo, Zhen-bing et al.; "An adjustable synthetic jet by a novel PZT-driven actuator with a slide block"; Institute of Physics Publishing; Journal of Physics; Conference Series; International MEMS Conference 2006; 34 (2006) pp. 487-492.

* cited by examiner

*Primary Examiner* — Darren W Gorman
(74) *Attorney, Agent, or Firm* — John A. Fortkort; Fortkort & Houston P.C.

(57) ABSTRACT

A synthetic jet ejector is provided which comprises a first housing portion (131), and a second housing portion (133) which releasably attaches to the first housing portion, wherein the first and second housing portions form first and second portions, respectively, of at least one passageway (159) adapted to emit at least one synthetic jet.

34 Claims, 44 Drawing Sheets

MOLDABLE HOUSING DESIGN FOR SYNTHETIC JET EJECTOR

CROSS REFERENCE TO RELATED APPLICATION

The present application claims priority from U.S. Provisional Patent Application Ser. No. 60/818,717, entitled "Moldable Housing Design for Synthetic Jet Ejector", which was filed on Jul. 5, 2006, and which is incorporated herein by reference in its entirety.

FIELD OF THE DISCLOSURE

The present disclosure relates generally to thermal management devices, and more particularly to methods for making synthetic jet ejectors.

BACKGROUND OF THE DISCLOSURE

As the size of semiconductor devices has continued to shrink and circuit densities have increased accordingly, thermal management of these devices has become more challenging. In the past, thermal management in semiconductor devices was often addressed through the use of forced convective air cooling, either alone or in conjunction with various heat sink devices, and was accomplished through the use of fans. However, fan-based cooling systems are undesirable due to the noise attendant to their use. Moreover, the use of fans requires relatively large moving parts, and correspondingly high power inputs, in order to achieve the desired level of heat transfer. Furthermore, while fans are adequate for providing global movement of air over electronic devices, they generally provide insufficient localized cooling to provide adequate heat dissipation for the hot spots that typically exist in semiconductor devices and in many types of electronic equipment.

More recently, thermal management systems have been developed which utilize synthetic jet ejectors. These systems are more energy efficient than comparable fan-based systems, and also offer reduced levels of noise and electromagnetic interference. Systems of this type are described in greater detail, for example, in U.S. Pat. No. 6,588,497 (Glezer et al.). The use of synthetic jet ejectors has proven very efficient in providing localized heat dissipation, and hence can be used to address hot spots in semiconductor devices and electronic equipment. Synthetic jet ejectors may be used in conjunction with fan-based systems to provide thermal management systems that afford both global and localized heat dissipation.

Despite their notable advantages, however, there is a need in the art for further improvements in synthetic jet ejectors. In particular, many synthetic jet ejectors currently available or proposed in the literature have designs that are difficult and costly to manufacture, and that lack adequate safeguards to ensure proper assembly. There is thus a need in the art for synthetic jet ejectors, and for methods of making the same, which overcome these infirmities. These and other needs may be met by the systems and methodologies disclosed herein.

SUMMARY OF THE DISCLOSURE

In one aspect, a method is provided for making a synthetic jet ejector. In accordance with the method, first and second synthetic jet housing portions are molded out of a moldable material, and a synthetic jet actuator is encased in a synthetic jet housing formed by joining the first and second housing portions along a seam. The resulting synthetic jet housing contains at least one aperture adapted to emit a synthetic jet.

In another aspect, a synthetic jet ejector is provided which comprises a first housing portion, and a second housing portion which attaches to the first housing portion. The first and second housing portions form first and second portions, respectively, of at least one passageway adapted to emit at least one synthetic jet.

DETAILED DESCRIPTION

It has now been found that the aforementioned needs may be met through the provision of a synthetic jet ejector housing design that permits synthetic jet ejectors to be manufactured and assembled from a small number (preferably one or two) of housing components that can be readily fabricated through common molding techniques using relatively simple (and therefore relatively inexpensive) molds, and that preferably integrate most or all of the nozzles and actuator mountings of the synthetic jet ejector. Preferably, the housing components are used in conjunction with a synthetic jet actuator module designed such that the housing components and synthetic jet actuator module can be readily assembled into a complete synthetic jet ejector or thermal management unit.

Figure 1:
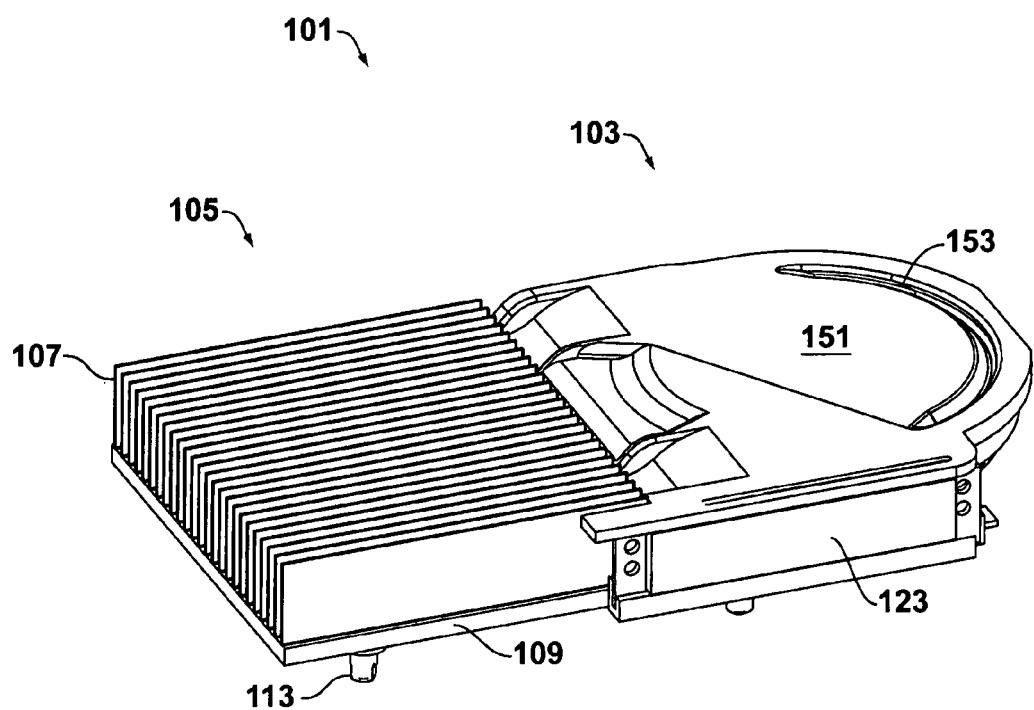
FIG. 1 is a perspective view of a thermal management system in accordance with the teachings herein.
Figure 2:
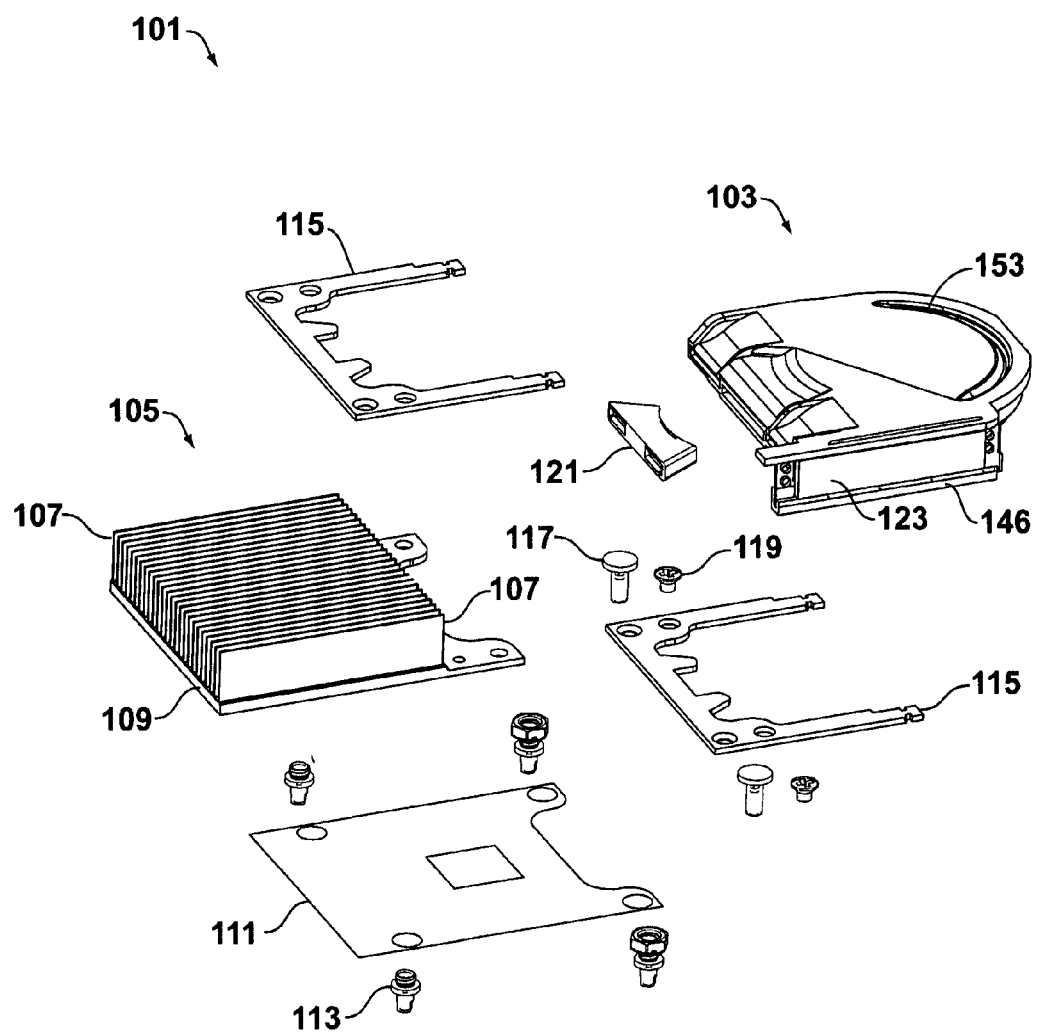
FIG. 2 is an exploded view of the thermal management system of FIG. 1.
Figure 3:
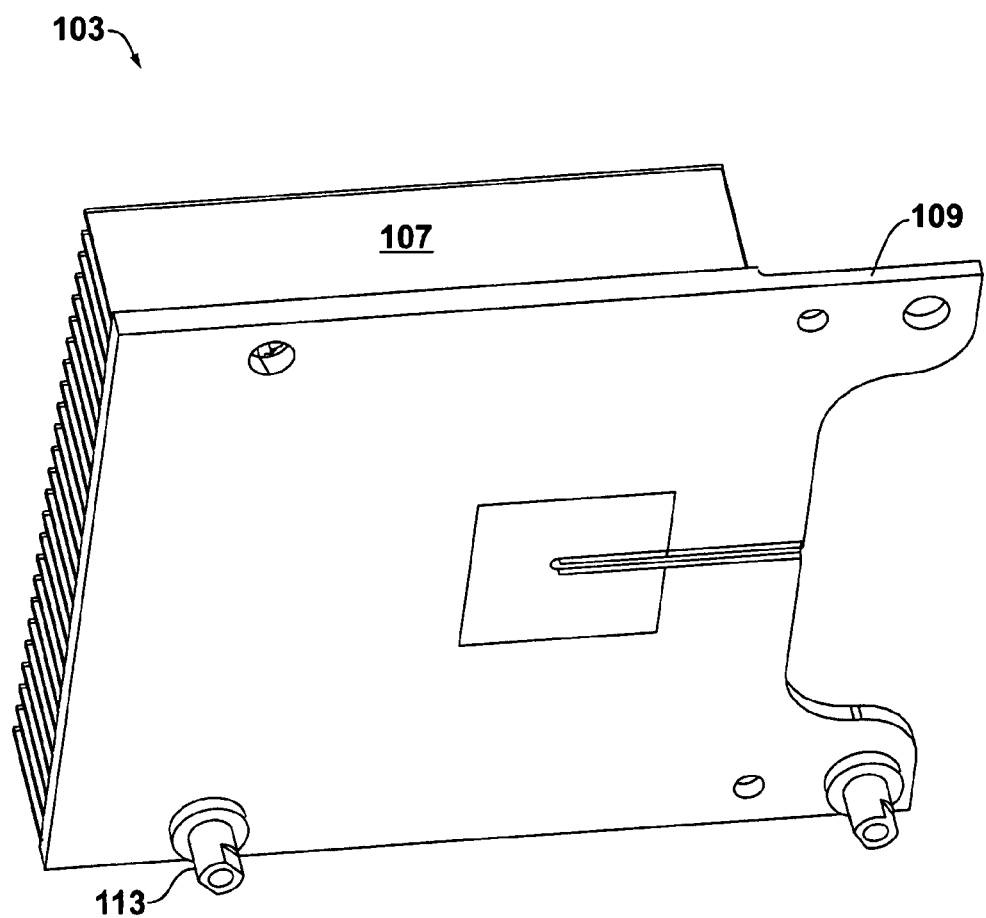
FIG. 3 is a perspective view of the heat sink used in the thermal management system of FIG. 1.
Figure 4:
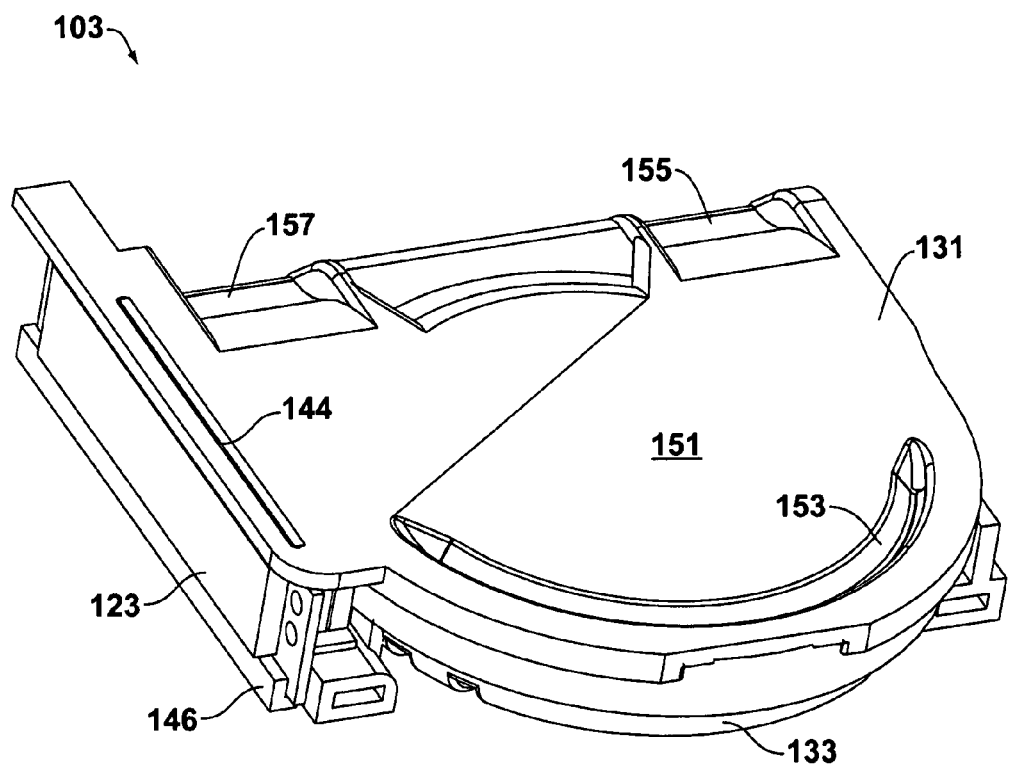
FIG. 4 is a perspective view of the synthetic jet ejector used in the thermal management system of FIG. 1.

FIGS. 1-2 depict a first particular, non-limiting embodiment of a thermal management system in accordance with the teachings herein. The thermal management system 101 depicted therein comprises a synthetic jet ejector 103 and a heat sink 105. The heat sink 105 in this particular embodiment comprises an array of fins 107 which are disposed on a thermally conductive base 109. The base 109 includes an optional insulation sheet 111 (see FIG. 2). In a typical embodiment, any of the fins 107, base 109, or heat sink 105 may comprise aluminum, copper, tin, or various other metals, metal alloys, and thermally conductive materials as are known to the art. A plurality of fasteners 113 can be used as part of a tensioning system to maintain the heat sink 105 in contact with, and in proper orientation with respect to, a heat source or substrate.

With reference to FIG. 2, the synthetic jet ejector 103 in this particular embodiment is mounted in proper orientation with respect to the heat sink 105 by way of leaf springs 115, grommets 117, fasteners 119, and a mount 121 such that the synthetic jets produced by the synthetic jet ejector 103 are directed between the fins 107 and in a direction parallel to the longitudinal axes thereof. Mounting provisions for a circuit board 123 are also provided as part of the molded housing. It will be appreciated, of course, that various other means and devices may be utilized to key the synthetic jet ejector 103 to the heat sink 105 in accordance with the teachings herein, and to affect the mounting of the thermal management system and its components to a substrate.

Referring now to FIGS. 4-7, the synthetic jet ejector 103 is shown in greater detail. As seen therein, the synthetic jet ejector 103 comprises an upper housing portion 131 and a lower housing portion 133 that, together, form a complete housing unit which encloses a synthetic jet actuator assembly 135 (see FIGS. 6-7 and 13-14). The synthetic jet actuator assembly 135 in this particular embodiment comprises a permanent magnet 137 (best seen in FIGS. 7 and 14), a basket 139, an electromagnetic coil 141 (see FIG. 7), a diaphragm 143 (best seen in FIGS. 6 and 14), and a surround 145.

FIGS. 6-14 illustrate, in greater detail, the features of the upper 131 and lower 133 housing elements of the synthetic jet ejector 103. As seen therein, the upper housing element 131 comprises a central area 151 which extends over the synthetic jet actuator assembly 135, and which is equipped about a portion of its periphery with a groove 153. The groove 153 allows for a corresponding protrusion on the bottom side of the upper housing element 131, while maintaining a uniform wall thickness. The protrusion may be used to assist in positioning the synthetic jet actuator, and/or to improve the internal air cavity characteristics. The upper housing element 131 is further equipped with a slot 144 for the releasable attachment of the mounting bracket 123 thereto. Similarly, the lower housing element 133 is equipped with a rail 146 for the releasable attachment of the printed circuit board 123 thereto.

The upper housing element 131 is further equipped with first 155 and second 157 sloped portions that align with complimentary shaped first 159 and second 161 sloped portions in the lower housing element 133. Together, the first sloped portion 155 of the upper housing element 131 and the first sloped portion 159 of the lower housing element 133 form a first passageway 163 (see FIG. 5) from which is emitted a first synthetic jet or, more typically, a first plurality of synthetic jets. Similarly, the second sloped portion 157 of the upper housing element 131 and the second sloped portion 161 of the lower housing element 133 together form a second passageway 165 from which is emitted a second synthetic jet or (more typically) a second plurality of synthetic jets. In the particular embodiment depicted, a third passageway 167 is also provided which is integrated into the lower housing element 133. In the particular embodiment depicted, the first 163, second 165 and third 167 passageways are physically sealed off from each other.

Of course, it will be appreciated that, in other embodiments of synthetic jet ejectors made in accordance with the teachings herein, virtually any number of passageways, apertures or nozzles may be integrated into either the upper 131 or lower 133 housing elements, or may be formed by the combination of the upper 131 and lower 133 housing elements (or features thereof) when the housing elements are joined along a common seam.

The upper 131 and lower 133 housing elements may also be equipped with various features that ensure proper assembly of the device and, in particular, that provide keying to ensure proper orientation of the various features with respect to each other. For example, with reference to FIG. 9, it can be seen that the upper housing element 131 is equipped with a circumferential groove 181 defined by first 183 and second 185 walls which engage the upper lip 186 (see FIG. 10) of the lower housing element 133. The shape of the groove 181 is such that the upper 131 and lower 133 housing elements will only engage each other completely when they are assembled in the proper orientation.

Figure 10:
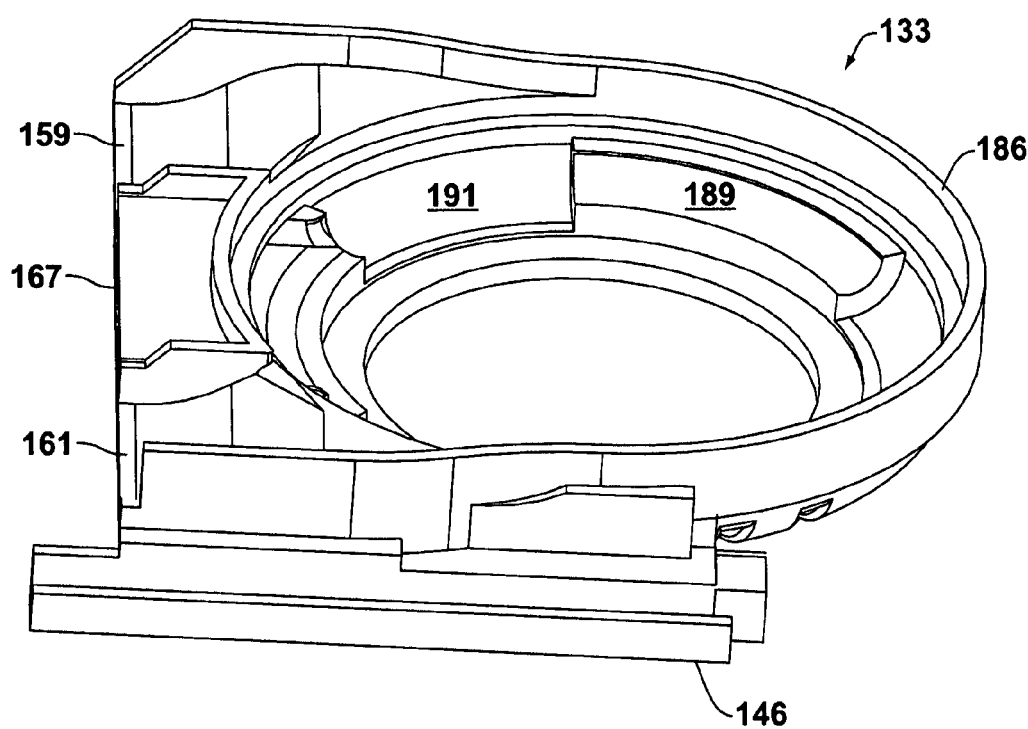
FIG. 10 is a perspective view of the lower housing element of the synthetic jet ejector of FIG. 5.
Figure 11:
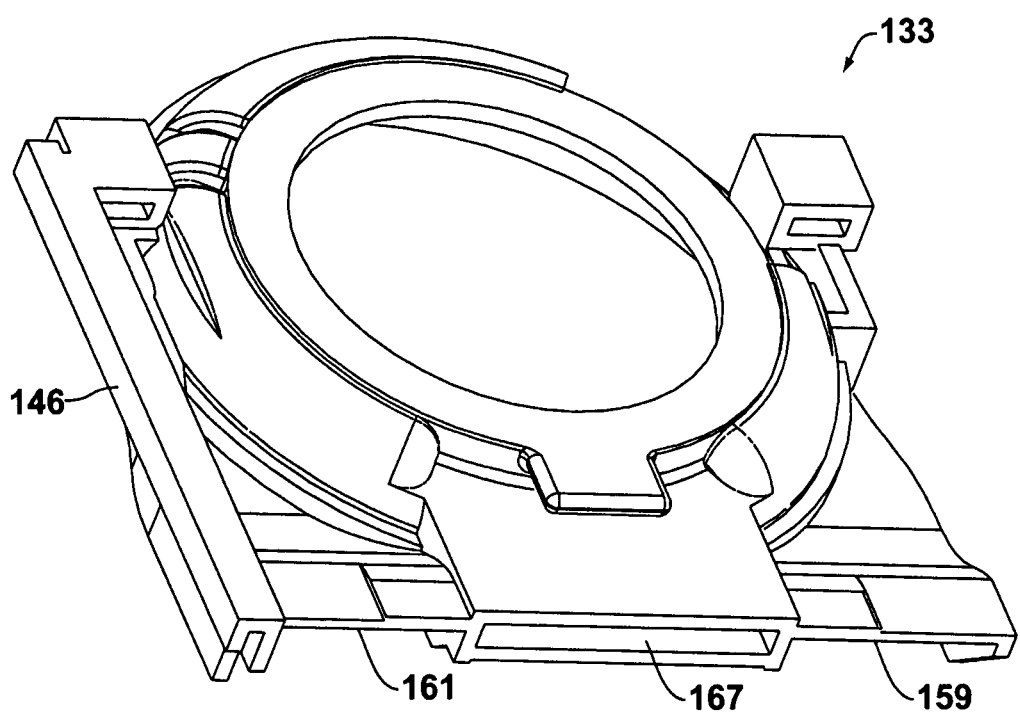
FIG. 11 is a perspective view of the lower housing element of the synthetic jet ejector of FIG. 5.

Similarly, as seen in FIG. 10, the lower housing element 133 is equipped with a plurality of keying features (in this case, a plurality of alternating protrusions 189 and indentations 191) which ensure that the synthetic jet actuator 135 (see FIGS. 6-7) will sit in the housing in the proper orientation. The protrusions also provide the function of minimizing internal air volume within the housing, which may help to enhance the performance of the synthetic jet ejector.

Figure 12:
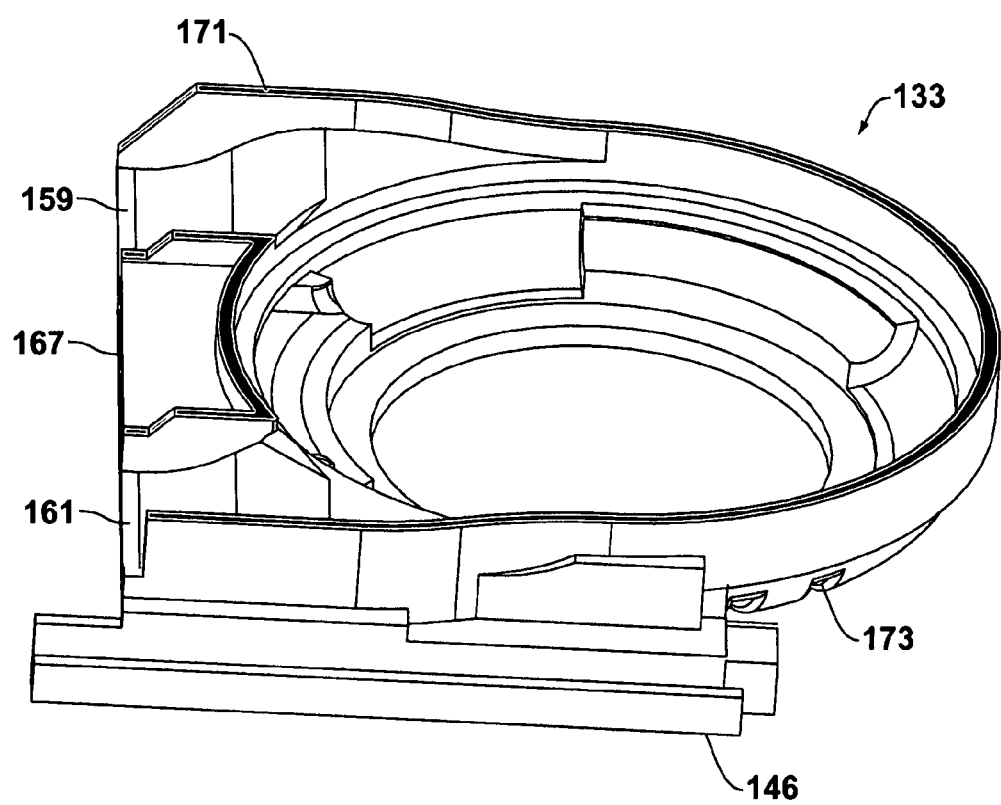
FIG. 12 is a perspective view depicting the means by which the bottom and top portions of the synthetic jet ejector of FIG. 5 may be sealed together.

FIG. 12 illustrates the manner in which the housing elements may be joined together. In the particular embodiment depicted, the periphery of the lower housing element 133 (and in particular, the upper lip 186 thereof; see FIG. 10) which abuts the upper portion 131 of the housing is equipped with a bead of adhesive 171 which secures the two portions together and forms an airtight seal. The adhesive 171 may be of various types, including drying, hot melt, reactive, and pressure sensitive adhesives. Some non-limiting examples include adhesive compositions based on epoxies, methacrylates, polyurethanes, polyesters, polyacryldiesters, silicones, and neoprene rubber.

In some embodiments, the adhesive may be replaced with, or used in conjunction with, ultrasonic welding, solvent bonding, or the use of gaskets or O-rings. In still other embodiments, the adjoining portions of the housing may comprise an elastomeric material and may be adapted to mechanically couple with each other (as, for example, by forming protrusions in one housing component that engage indentations in the other housing component) with sufficient compressive force so as to obtain a sufficient seal. Any of the foregoing techniques and materials may also be used to seal the wire ports 173 through which the wires that power the actuator extend.

The adhesive or sealant may be applied in a variety of ways. For example, one or both of the adjoining surfaces of the portions of the housing may be dipped in an adhesive or elastomer before the portions are joined together. The adhesive may also be selectively brushed onto these surfaces. In some embodiments, a release liner may be employed over the adhesive so that the parts can be adjoined at a later time (e.g., by the end user or assembler of the synthetic jet ejectors). The composition of such release liners will depend in part on the adhesive or sealant they are used in conjunction with, but may comprise, for example, fluorinated plastics such as polytetrafluoroethylene (PTFE), syndiotactic polystyrene, wax paper, and the like.

Figure 13:
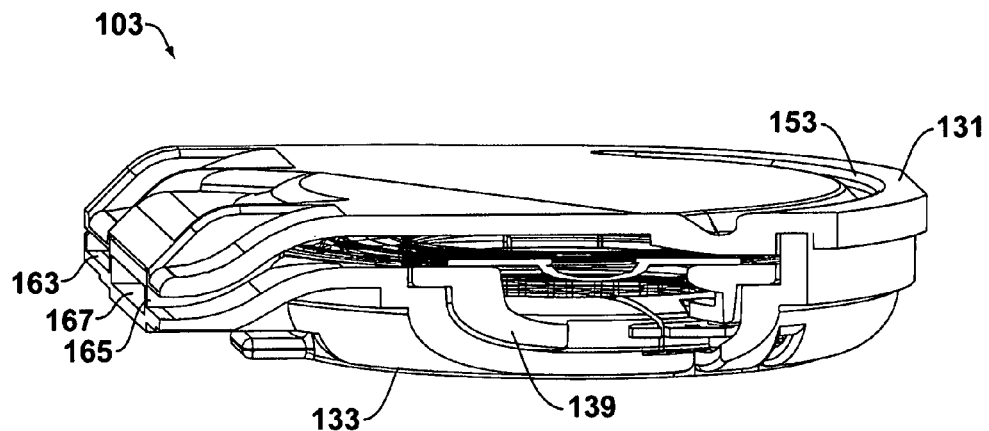
FIG. 13 is a cross-sectional illustration taken along LINE 13-13 of FIG. 5.
Figure 14:
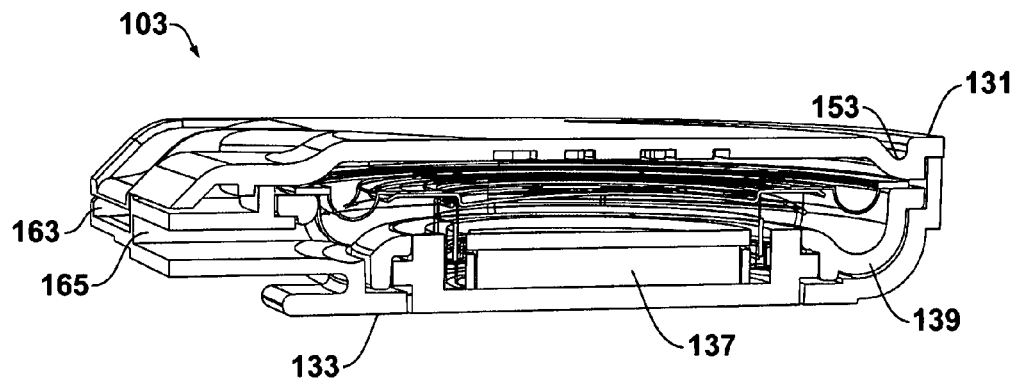
FIG. 14 is a cross-sectional illustration taken along LINE 14-14 of FIG. 5.
Figure 15:
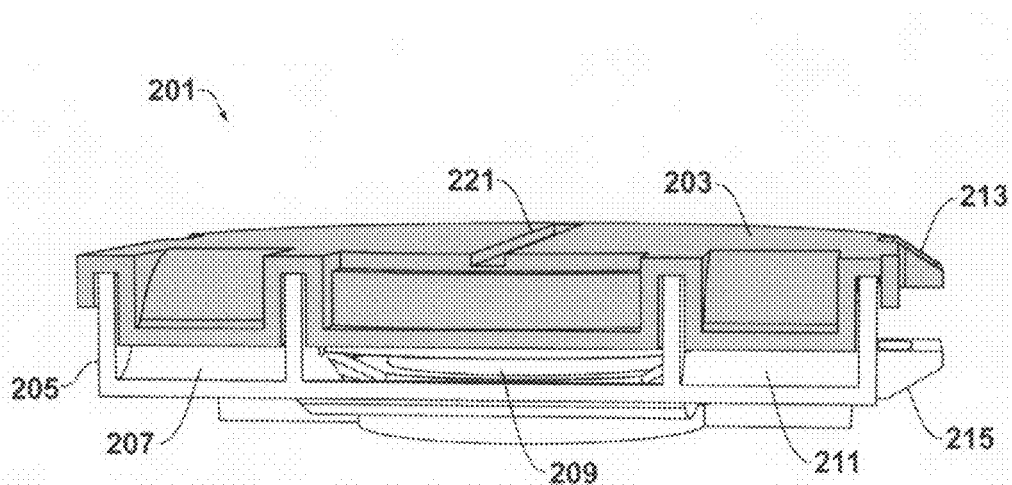
FIG. 15 is a perspective view of a second embodiment of a synthetic jet ejector made in accordance with the teachings herein.
Figure 16:
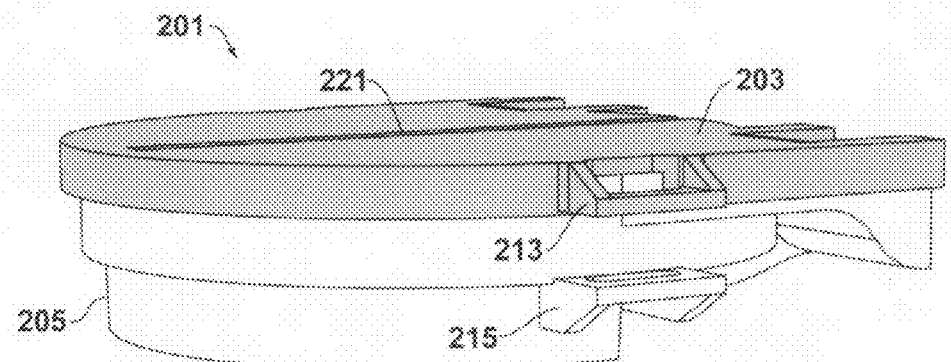
FIG. 16 is a perspective view of the synthetic jet ejector of FIG. 15.
Figure 17:
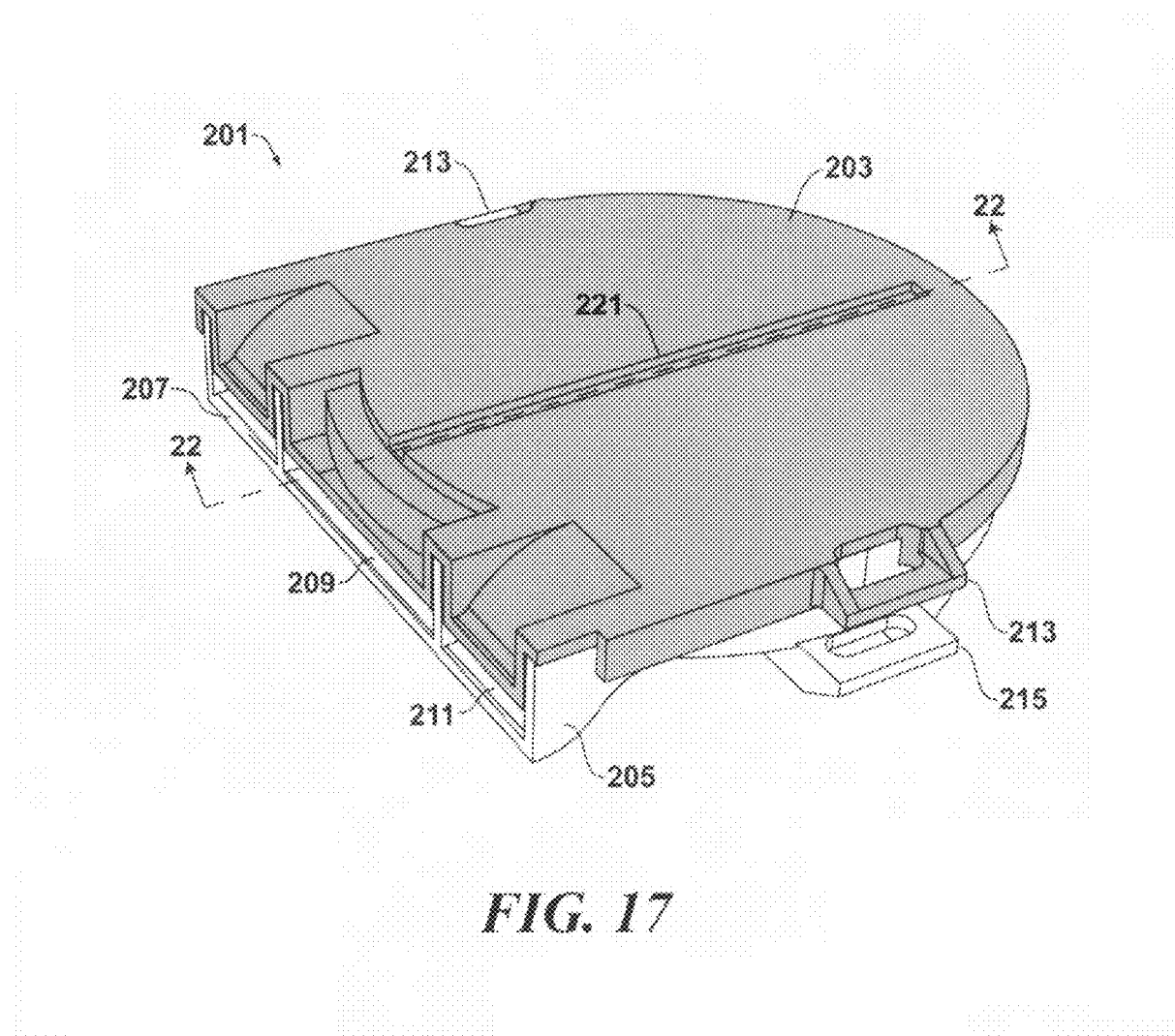
FIG. 17 is a perspective view of the synthetic jet ejector of FIG. 15.
Figure 18:
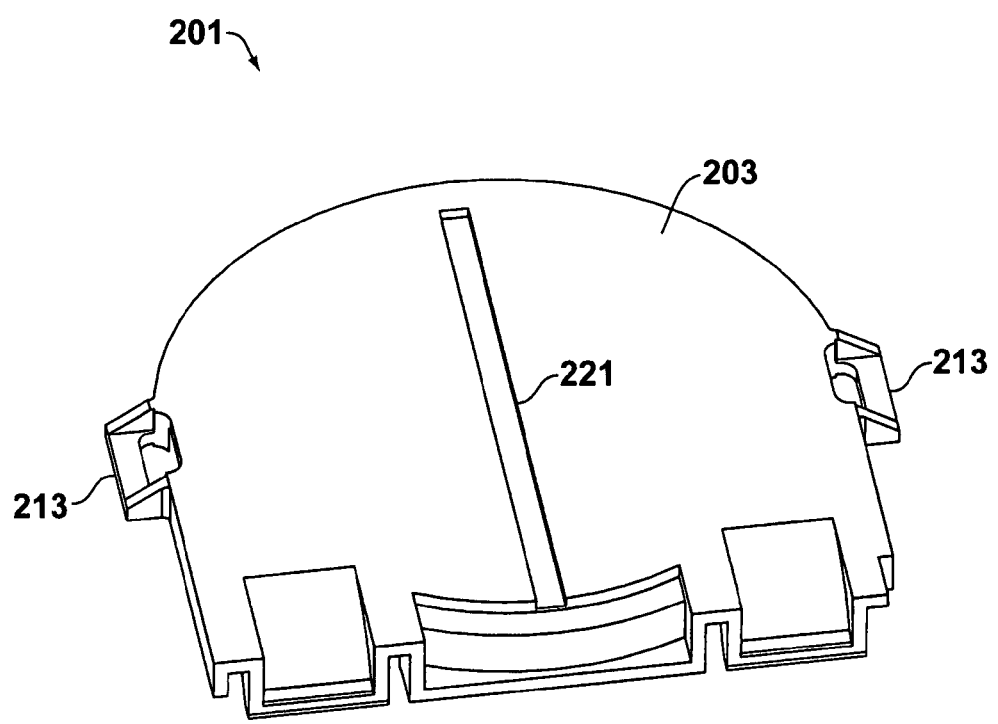
FIG. 18 is a perspective view of the upper housing element of the synthetic jet ejector of FIG. 15.
Figure 19:
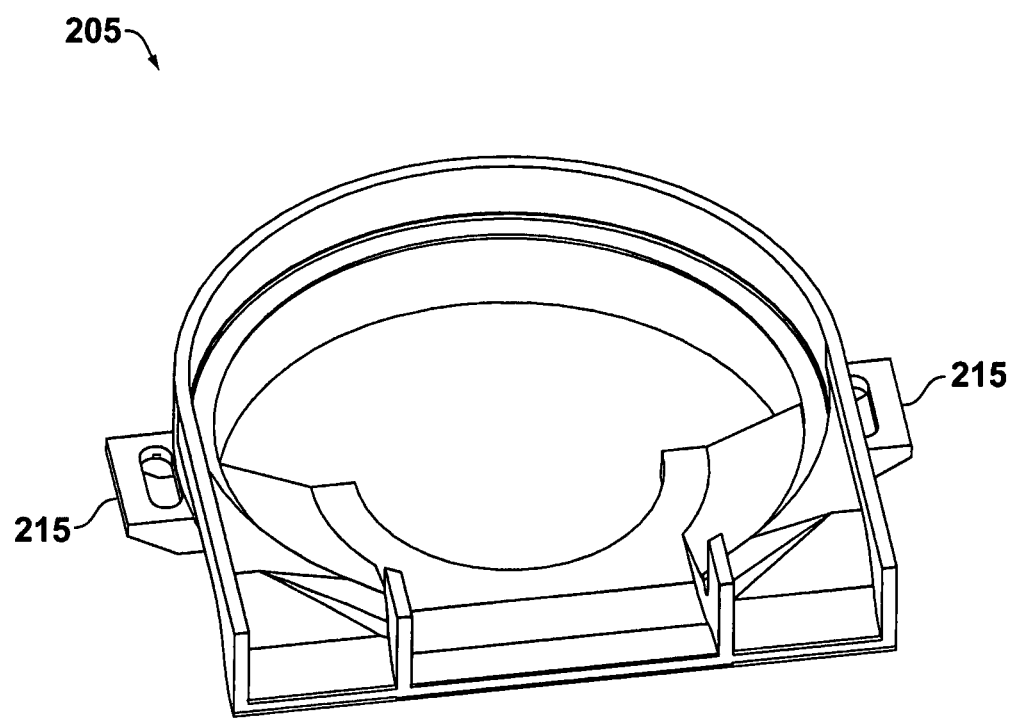
FIG. 19 is a perspective view of the lower housing element of the synthetic jet ejector of FIG. 15.
Figure 20:
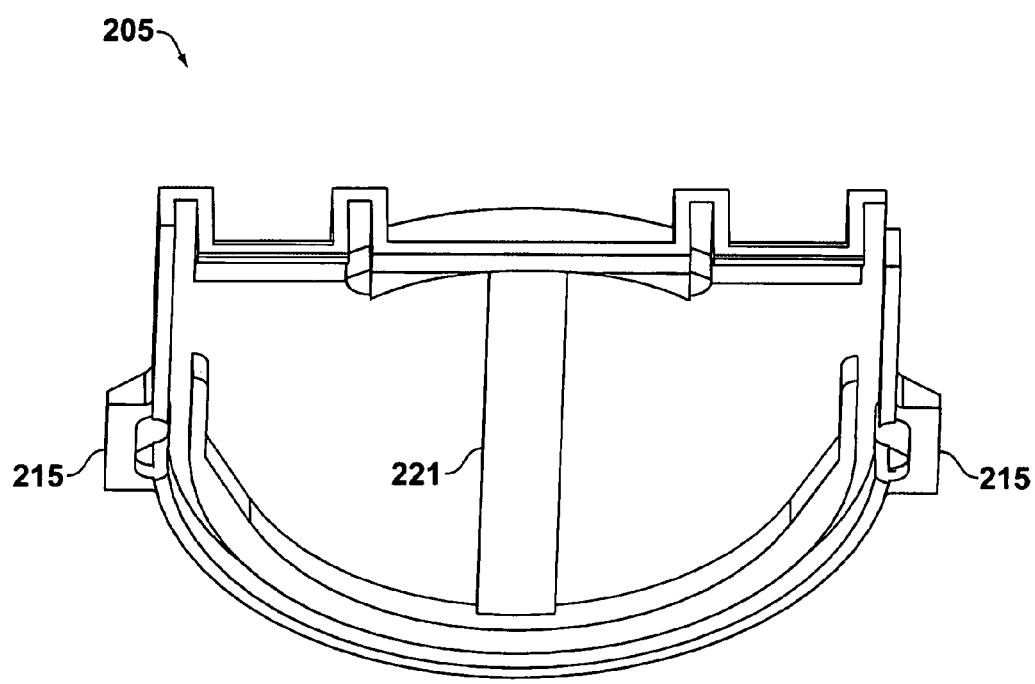
FIG. 20 is a perspective view of the upper housing element of the synthetic jet ejector of FIG. 15.
Figure 21:
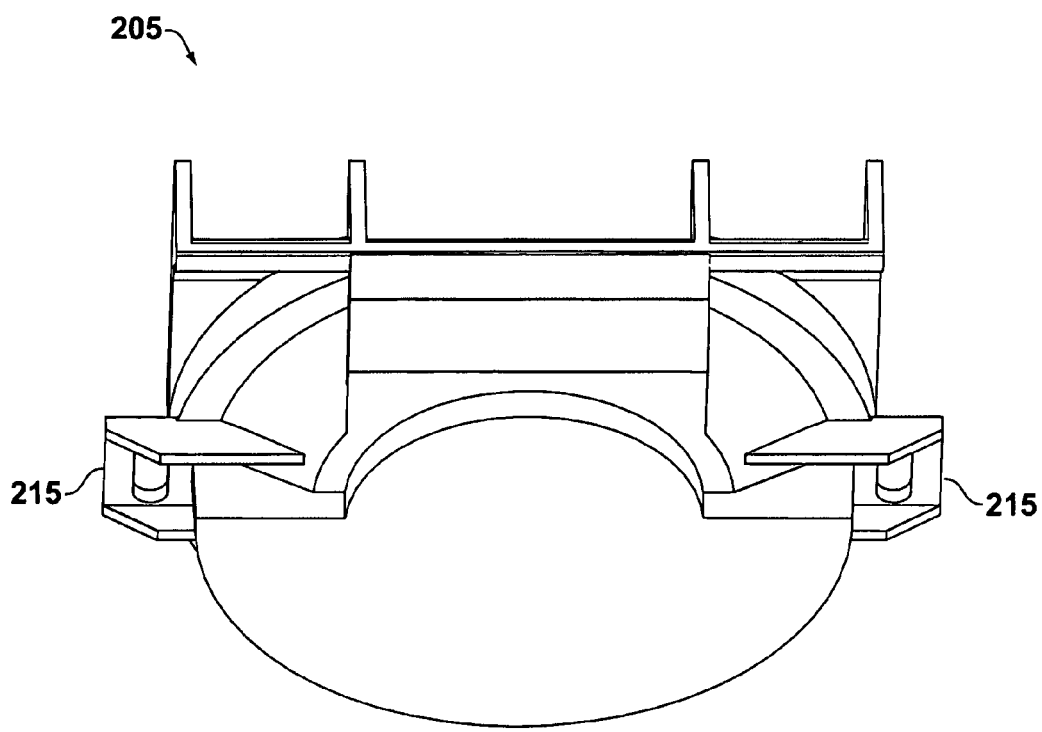
FIG. 21 is a perspective view of the lower housing element of the synthetic jet ejector of FIG. 15.

FIGS. 13-14 are cross-sectional illustrations which depict some of the details of the synthetic jet ejector 103 of FIG. 1. As seen therein, the upper 131 and lower 133 housing elements of the synthetic jet ejector 103 form an airtight seal and, between them, form the walls of channels 163 and 165. In this particular embodiment, channel 167 is formed by the lower housing element 133 alone.

FIGS. 15-22 illustrate a second particular, non-limiting embodiment of a synthetic jet ejector made in accordance with the teachings herein. The synthetic jet ejector 201 depicted therein comprises an upper housing element 203 and a lower housing element 205 which form, respectively, the upper and lower portions of channels 207, 209 and 211. The upper housing element 203 and the lower housing element 205 are equipped, respectively, with tabs 213 and 215. These tabs 213 and 215 may be used to form a mounting point for a vibration isolation system, and may also be used, if desired, to secure the synthetic jet ejector 201 to a substrate.

Figure 22:
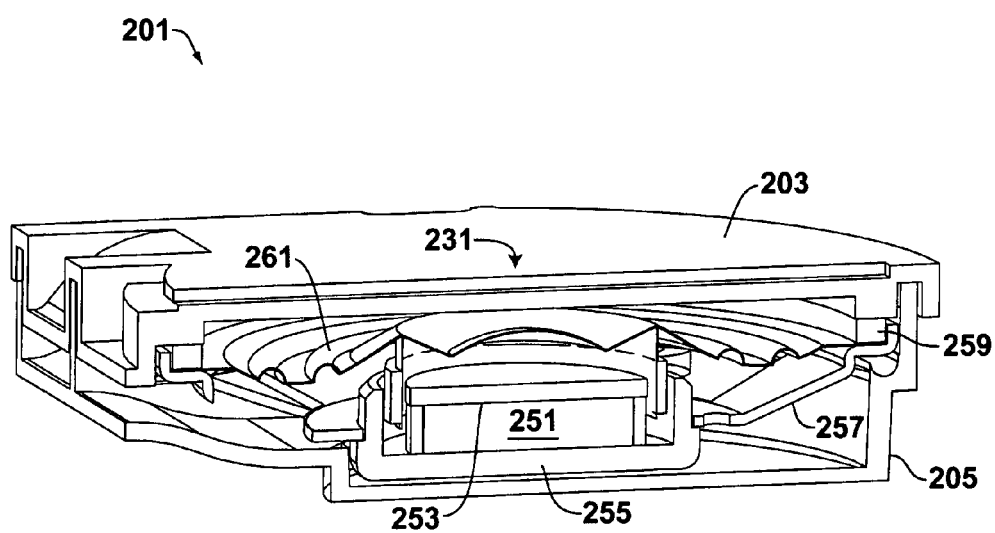
FIG. 22 is a cross-sectional illustration taken along LINE 22-22 of FIG. 17.
Figure 23:
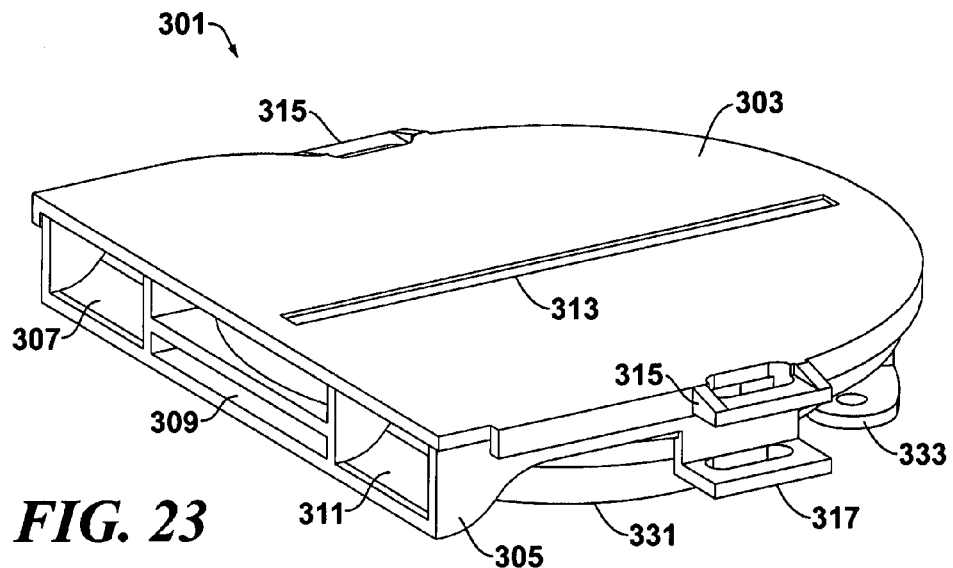
FIG. 23 is a perspective view of a third embodiment of a synthetic jet actuator made in accordance with the teachings herein.
Figure 24:
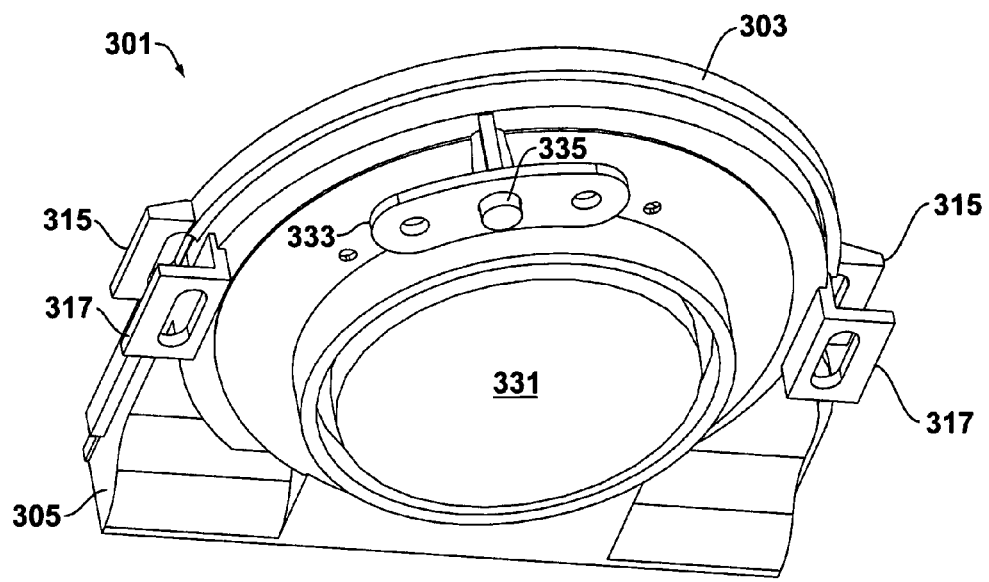
FIG. 24 is a perspective view of the synthetic jet ejector of FIG. 23.

The details of the synthetic jet actuator 231 utilized in the synthetic jet ejector 201 may be appreciated with respect to FIG. 22. As seen therein, the actuator 231, which is similar in most respects to the actuator of the first embodiment, comprises a permanent magnet 251 capped by a top plate 253, a pot 255, a basket 257, a suspension or surround 259, and a diaphragm 261.

The synthetic jet ejector housing 201 of FIGS. 15-22 is advantageous in that its design is particularly easy to mold. Unlike the previously described embodiment, in this embodiment, each of channels 207, 209 and 211 are formed by opposing surfaces of the upper 203 and lower 205 housing elements.

Figure 29:
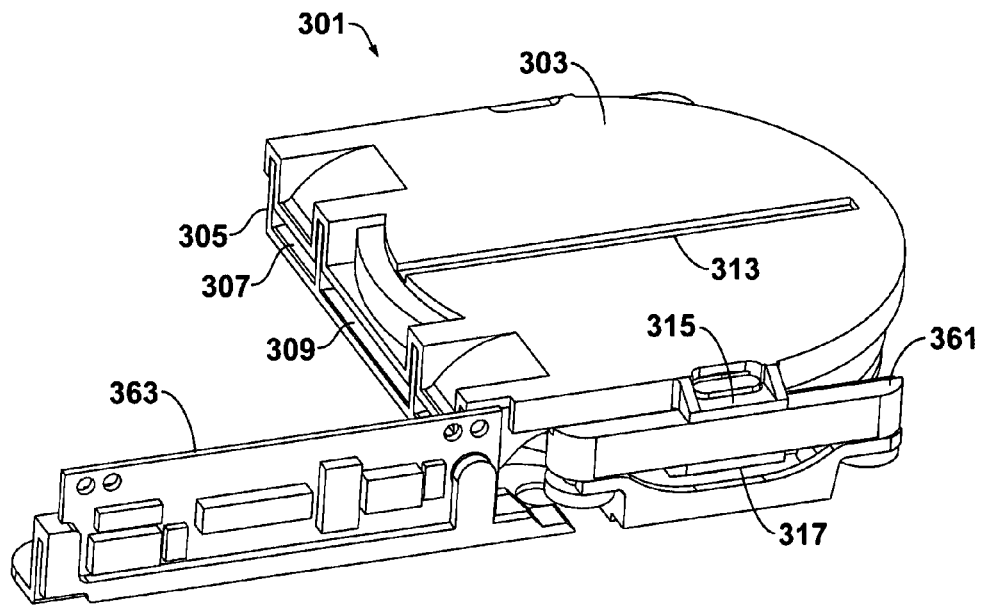
FIG. 29 is a perspective view of the synthetic jet ejector of FIG. 23 with a mounting element attached.
Figure 30:
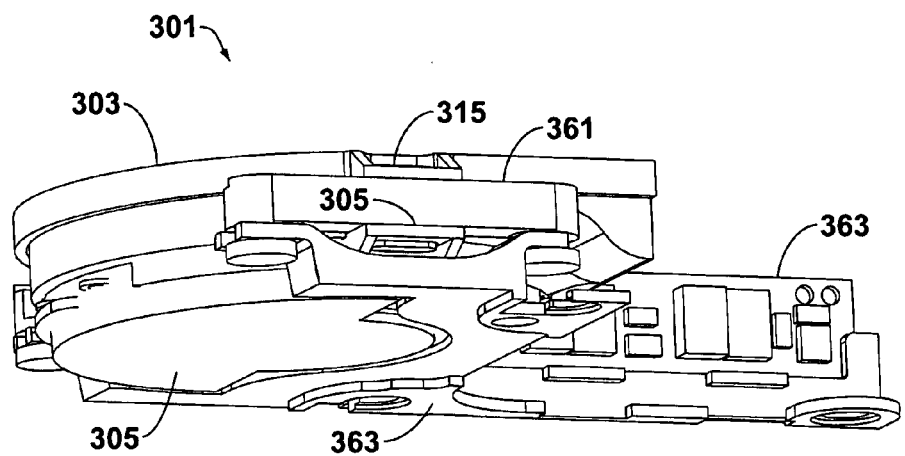
FIG. 30 is a perspective view of the synthetic jet ejector of FIG. 23 with a mounting element attached.
Figure 31:
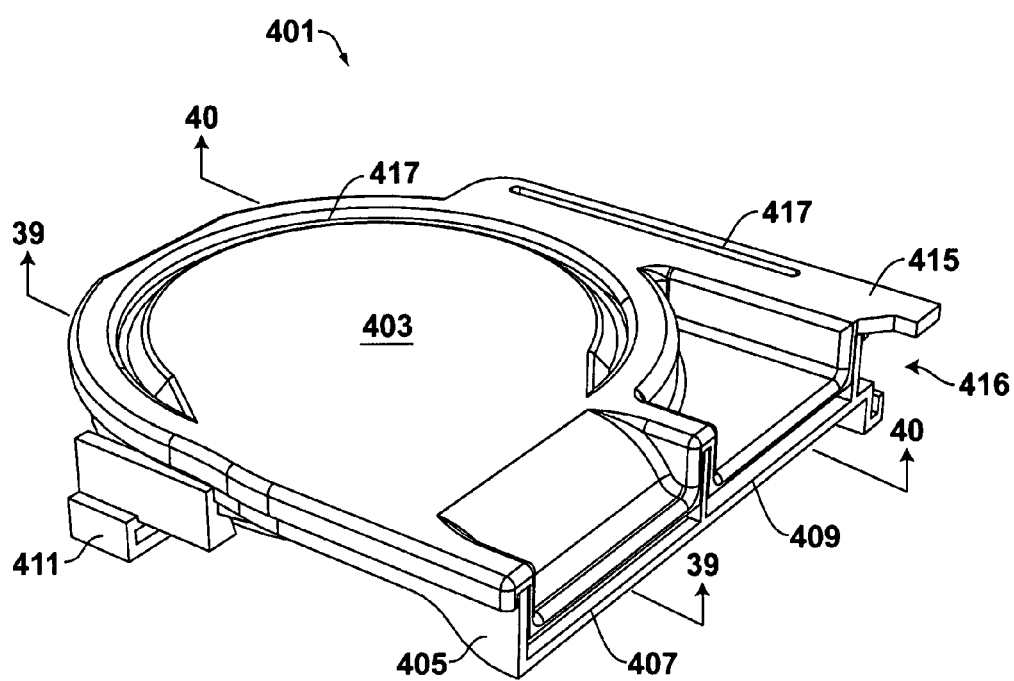
FIG. 31 is a perspective view of a fourth embodiment of a synthetic jet ejector in accordance with the teachings herein.
Figure 32:
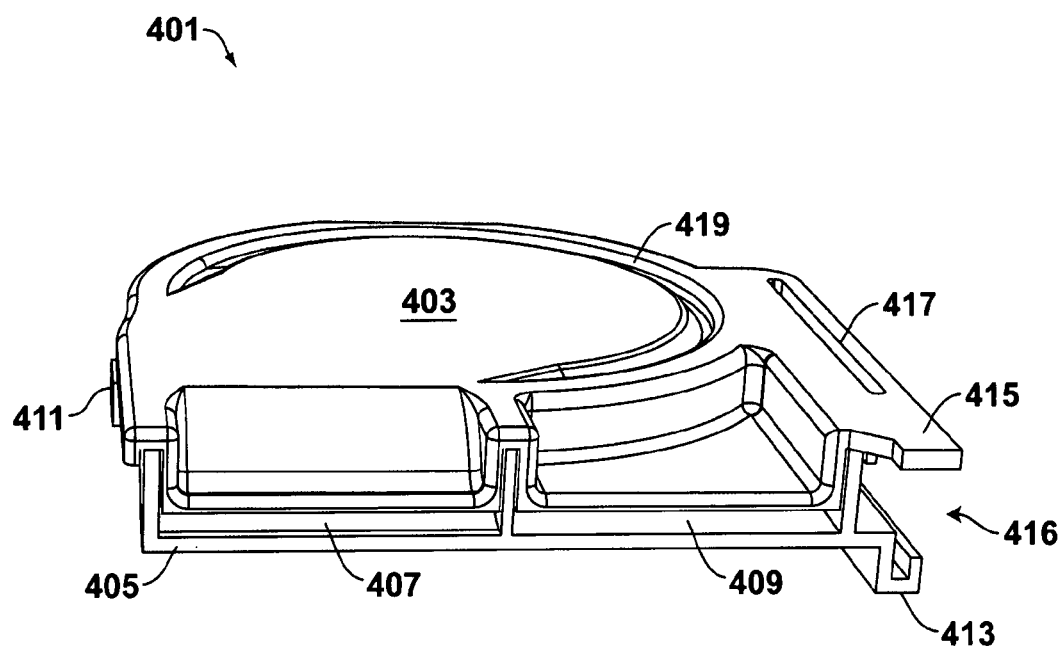
FIG. 32 is a perspective view of the synthetic jet ejector of FIG. 31.
Figure 33:
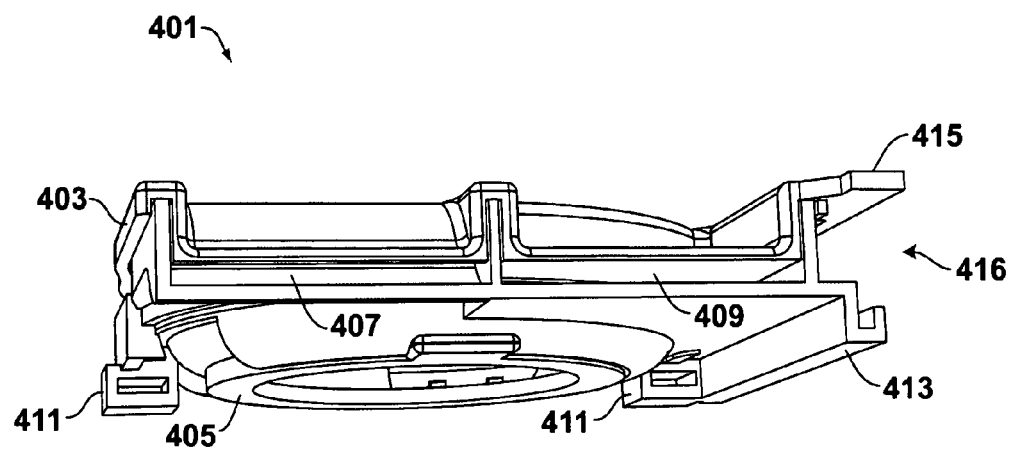
FIG. 33 is a perspective view of the synthetic jet ejector of FIG. 31.
Figure 34:
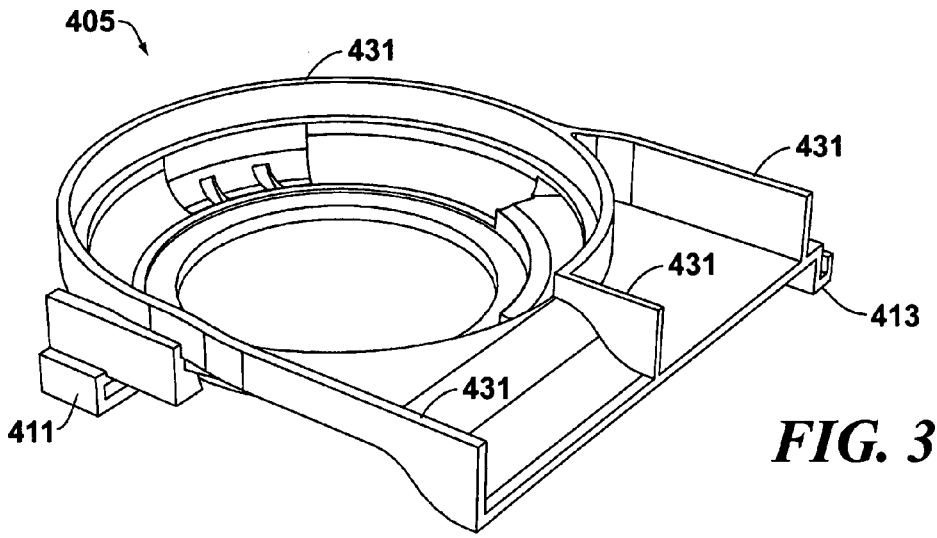
FIG. 34 is a perspective view of the lower housing element of the synthetic jet ejector of FIG. 31.
Figure 35:
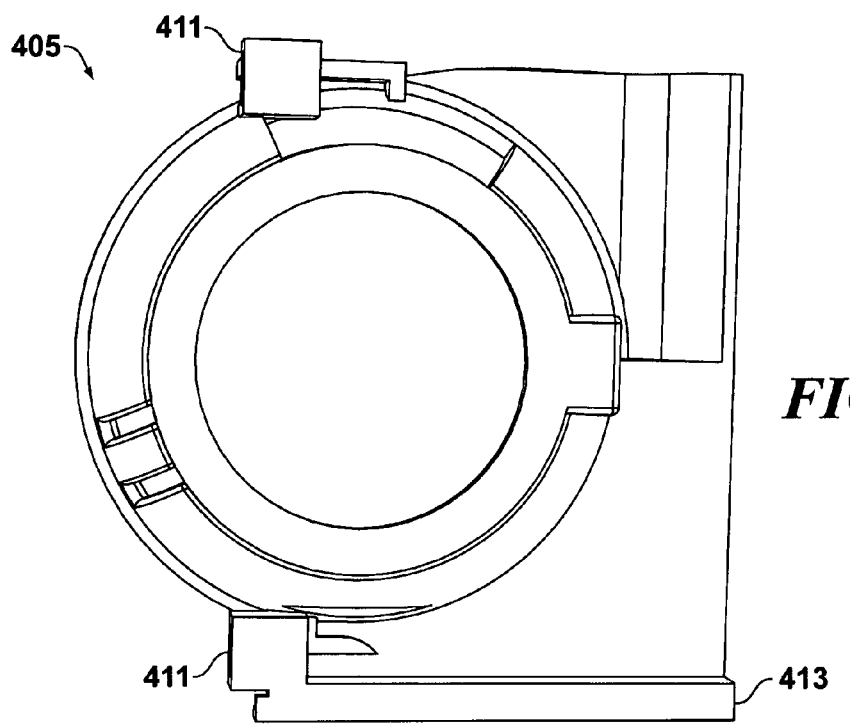
FIG. 35 is a bottom view of the lower housing element of the synthetic jet ejector of FIG. 31.
Figure 36:
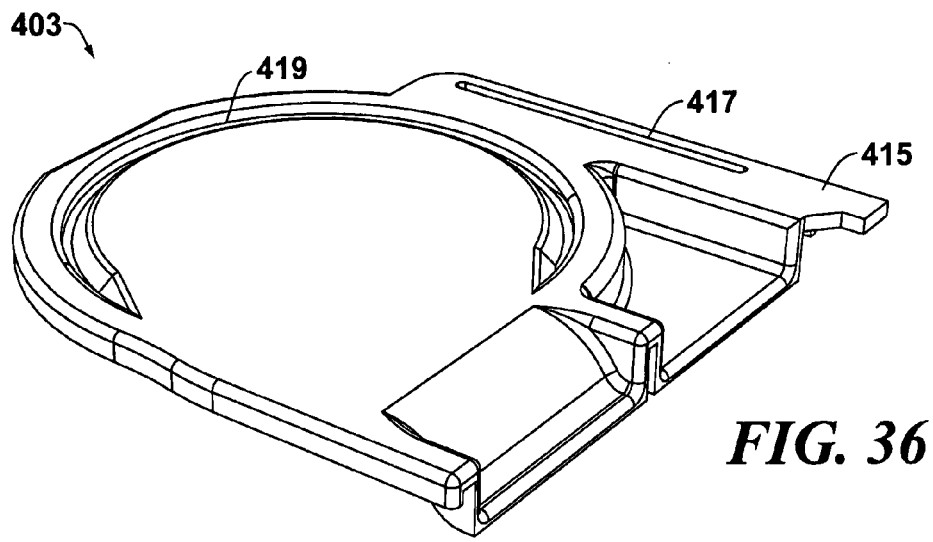
FIG. 36 is a perspective view of the upper housing element of the synthetic jet ejector of FIG. 31.

FIGS. 23-30 illustrate a third particular, non-limiting embodiment of a synthetic jet ejector made in accordance with the teachings herein. The synthetic jet ejector 301 depicted therein comprises a top housing element 303 and a bottom housing element 305 which, together, define channels 307, 309 and 311. The top 303 and bottom 305 housing elements are equipped with respective sets of tabs 315 and 317 which couple with vibration suppression elements 361 mounted on a support bracket 363 as seen in FIGS. 29-30 by way of apertures 353 which are provided therein (see FIG. 28). The synthetic jet ejector 301 is also equipped with a protrusion on the front end thereof which releasably mates with a bracket 333 which may be utilized to maintain the synthetic jet ejector 301 in a proper orientation when it is secured to a substrate.

Figure 25:
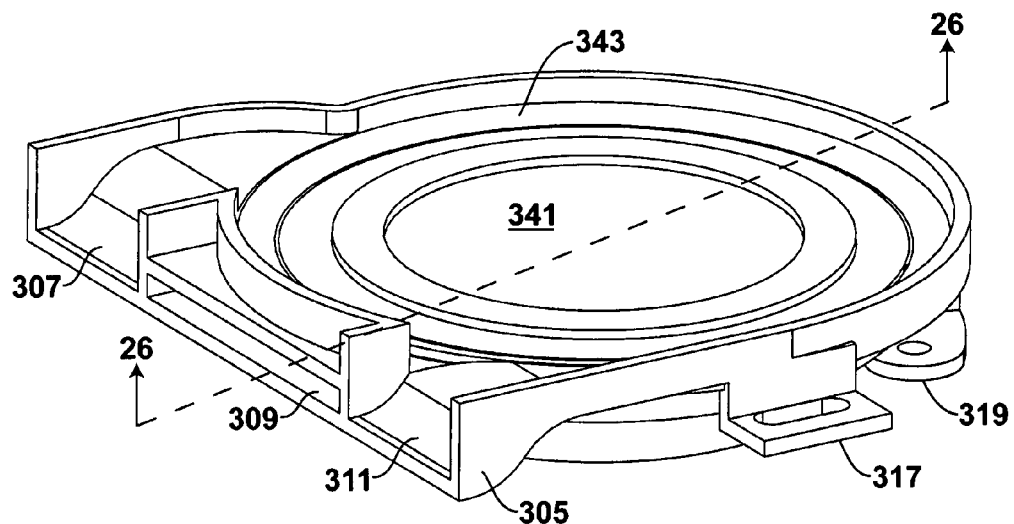
FIG. 25 is a perspective view of the synthetic jet ejector of FIG. 23 with the upper housing element removed.
Figure 26:
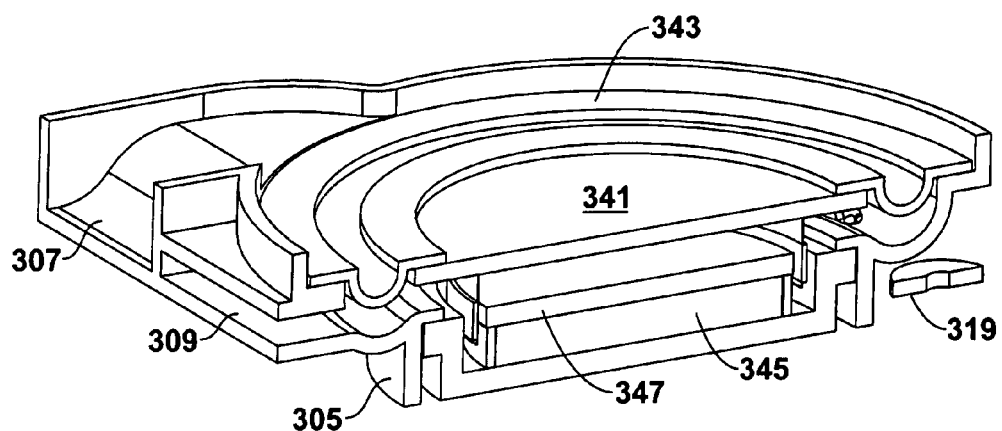
FIG. 26 is a cross-sectional view taken along LINE 26-26 of FIG. 25.
Figure 27:
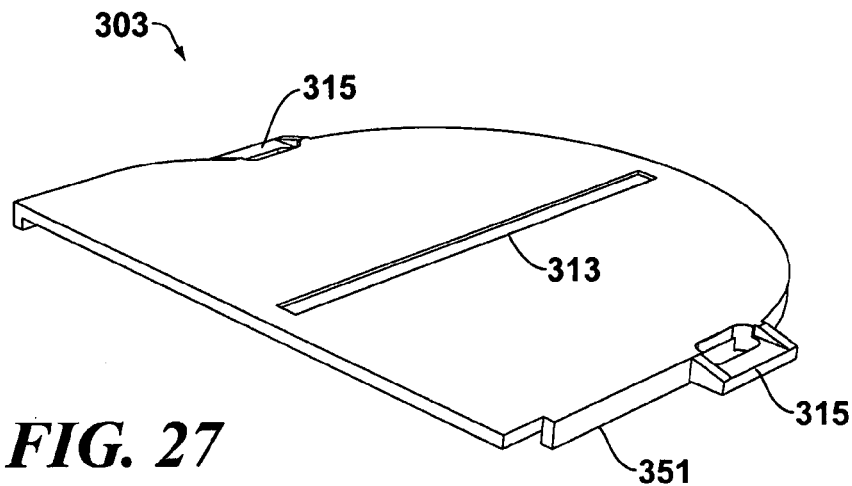
FIG. 27 is a perspective view of the upper housing element of the synthetic jet ejector of FIG. 23.
Figure 28:
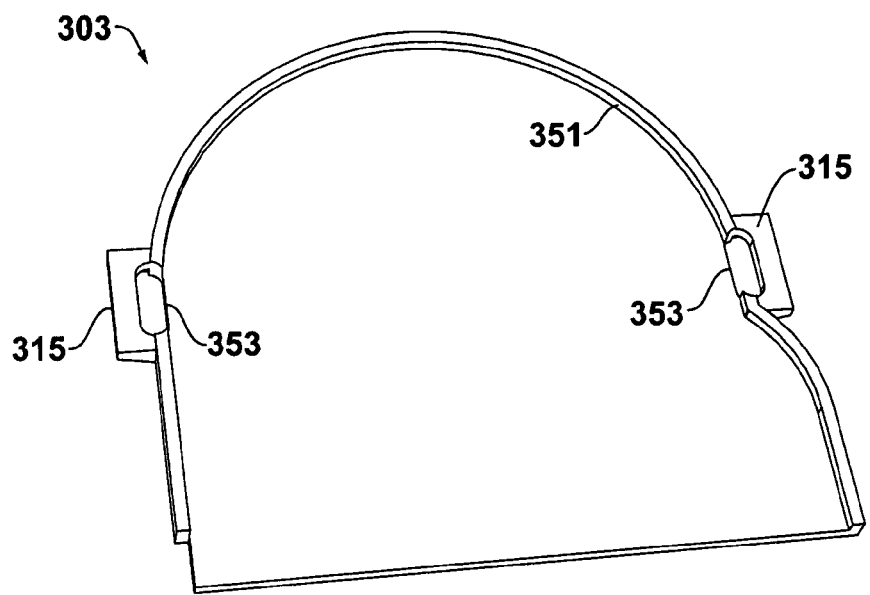
FIG. 28 is a perspective view of the upper housing element of the synthetic jet ejector of FIG. 23.

The internal components of the synthetic jet ejector 301 may be appreciated with respect to FIGS. 25-26. As seen therein, the synthetic jet ejector 301 is equipped with an actuator which comprises a diaphragm 341, a magnet 345 and a cap 347. The diaphragm 341 supported in the bottom housing element 305 by a surround 343 such that channels 307 and 311 are in open communication with the space above the diaphragm 341, and channel 309 is in open communication with the space below the diaphragm 341. When the diaphragm is vibrated at appropriate frequencies, air is drawn into the interior of the upper 103 and lower 105 housing elements by way of channels 307, 309 and 311, and is ejected therefrom in the form of one or more synthetic jets.

The bottom housing element 305 of the synthetic jet ejector 301 is integrated with a synthetic jet actuator 307 such that the bottom housing element 305, and in particular components 308 and 309 thereof, form the basket of the synthetic jet actuator 307. This approach not only eliminates a component from the assembly, but also, with proper design, can be used to ensure correct orientation or keying of the synthetic jet actuator 307 to the synthetic jet ejector housing. In such an embodiment, the diaphragm 311 of the synthetic jet actuator may be bonded directly to the bottom element 305.

FIGS. 31-40 illustrate a fourth particular, non-limiting embodiment of a synthetic jet ejector made in accordance with the teachings herein. The synthetic jet ejector 401 depicted therein comprises an upper housing element 403 and a lower housing element 405, and is equipped with channels 407 and 409 through which ambient air is drawn into the device and is emitted as one or more synthetic jets. The synthetic jet ejector 401 is secured to a substrate by way of a mounting element 411, and a similar feature provided on the second side of the lower housing element 405. Mounting provisions for an electrical circuit board 416 include a rail 413 and opposing plate 415. Plate 415 is equipped with a slot through which a protrusion of a suitable mounting bracket may be extended.

Figure 37:
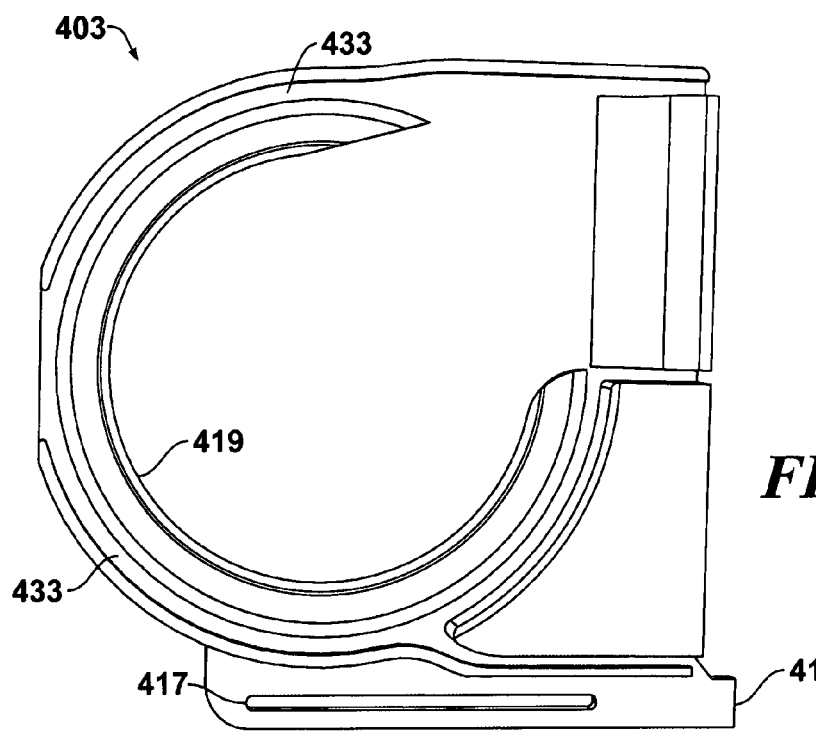
FIG. 37 is a top view of the upper housing element of the synthetic jet ejector of FIG. 31.
Figure 38:
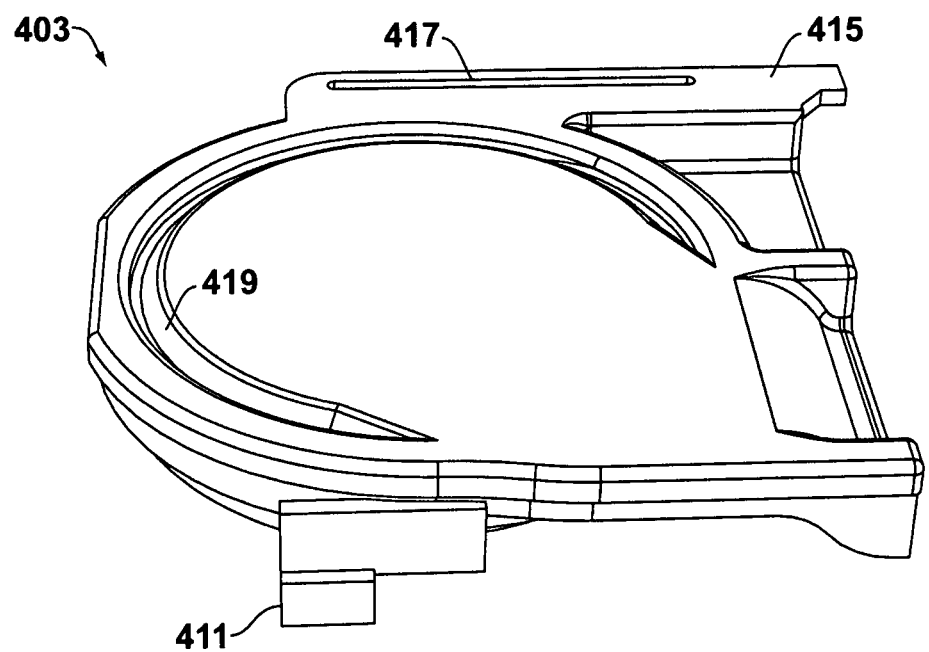
FIG. 38 is a perspective view of the upper housing element of the synthetic jet ejector of FIG. 31.
Figure 39:
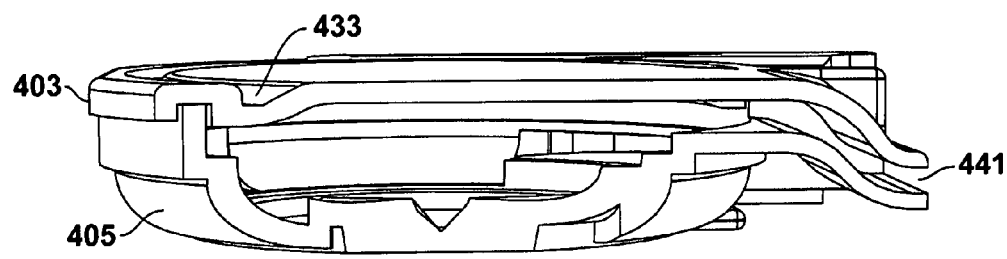
FIG. 39 is a cross-section taken along LINE 39-39 of FIG. 31.
Figure 40:
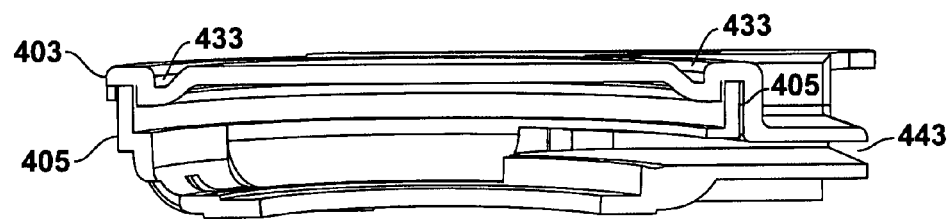
FIG. 40 is a cross-section taken along LINE 40-40 of FIG. 31.
Figure 41:
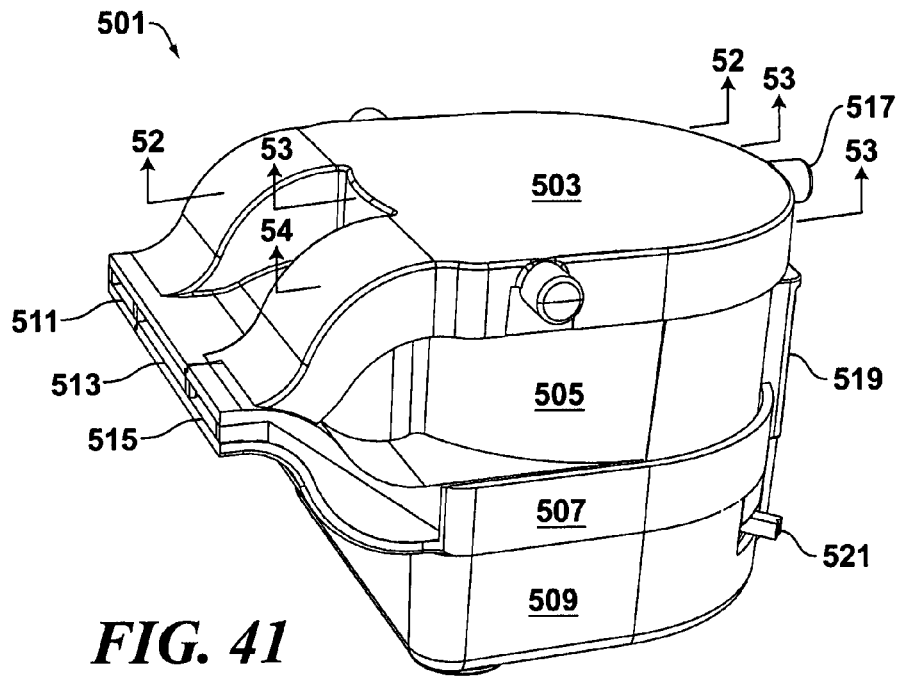
FIG. 41 is a perspective view of a fifth embodiment of a synthetic jet ejector in accordance with the teachings herein.
Figure 42:
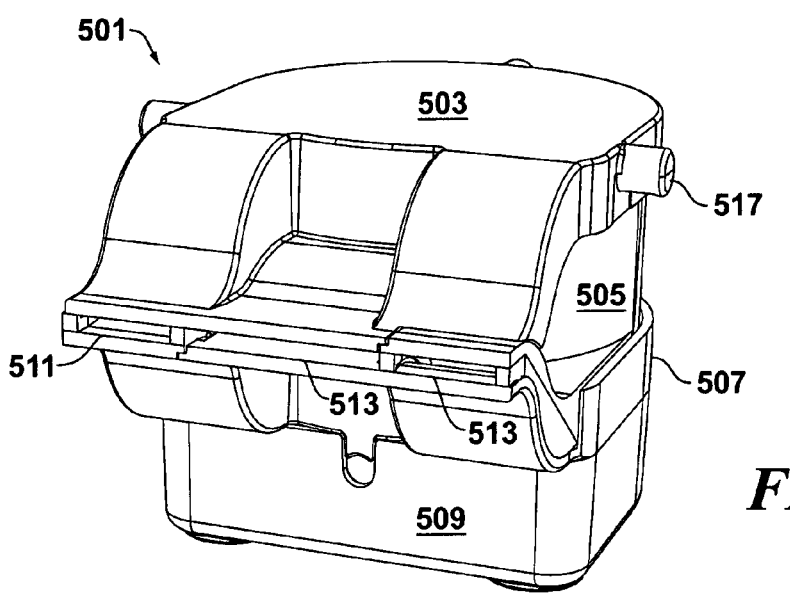
FIG. 42 is a perspective view of the synthetic jet ejector of FIG. 41.
Figure 43:
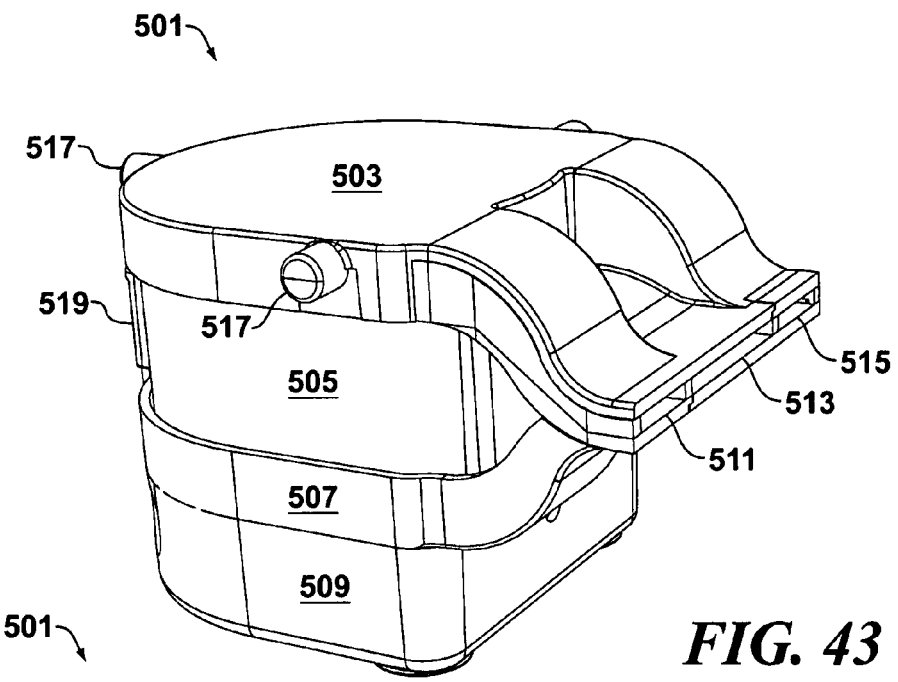
FIG. 43 is a perspective view of the synthetic jet ejector of FIG. 41.

The upper housing element 403 has an arcuate depression 419 defined therein. As seen in FIG. 37, this depression is used to define one of two opposing ridges on the opposing surface of the upper housing element 403 which define a circumferential slot 433 which mates with the edge 431 (see FIG. 34) of the lower housing element 405, thereby securing the upper housing element 403 to the lower housing element 405.

FIGS. 41-62 illustrate a fifth particular, non-limiting embodiment of a synthetic jet ejector made in accordance with the teachings herein. The synthetic jet ejector 501 depicted therein is a dual actuator device equipped with an upper housing element 503, a first middle housing element 505, a second middle housing element 507, and a lower housing element 509. Upon assembly, the upper housing element 503, first middle housing element 505, and second middle housing element 507 define channels 511, 513 and 515. Ambient air is drawn into the device and is emitted as one or more synthetic jets by way of channels 511, 513 and 515. The lower housing element 509 performs multiple functions, including providing an electronic circuit board housing, providing a mounting base, and providing apertures 583 and 585 (see FIG. 61) for an indicator LED (not shown), a control switch 521 (see FIG. 45), and a power connector 523 (see FIG. 44).

The upper housing element 503 is equipped with a plurality of hollowed protrusions 517 disposed around the periphery thereof. These protrusions 517, which may be seen in greater detail in FIG. 56, have an aperture therein and may be used to releasably secure an exterior chassis, panel or skin to the synthetic jet ejector 503. These protrusions 517 may also be used to secure the synthetic jet ejector 503 within a host device. Thus, for example, these protrusions 517 may be utilized to secure the synthetic jet ejector 501 of FIGS. 41-62 within a device which creates an airflow around a computer mouse or keypad.

Figure 44:
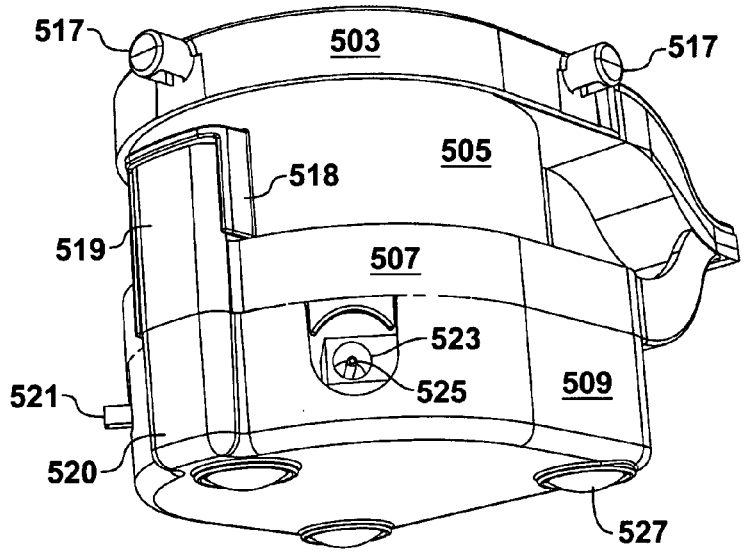
FIG. 44 is a perspective view of the synthetic jet ejector of FIG. 41.
Figure 45:
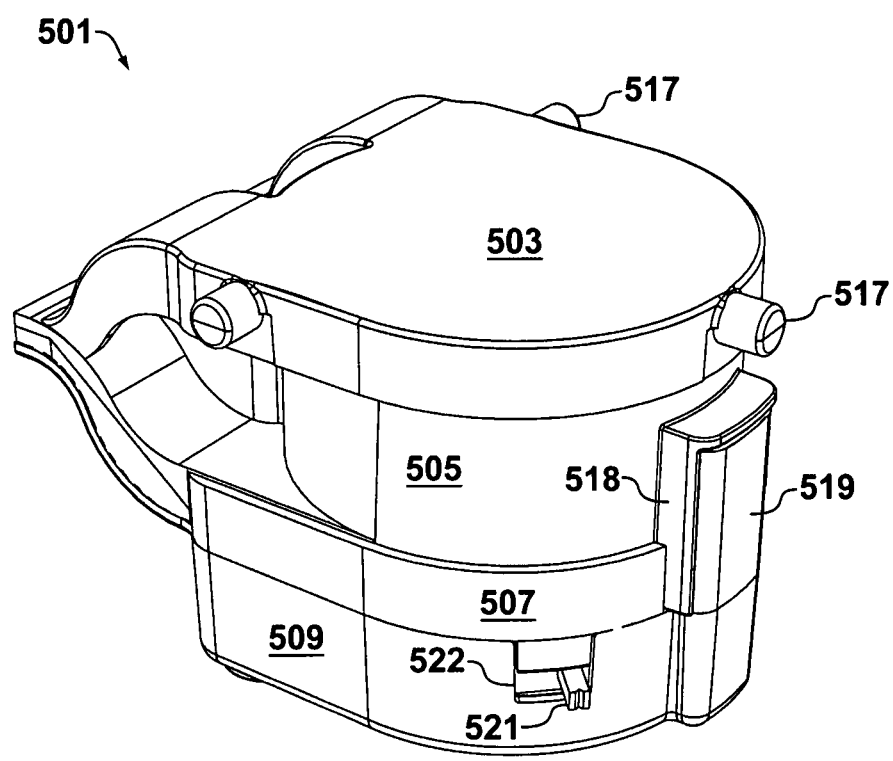
FIG. 45 is a perspective view of the synthetic jet ejector of FIG. 41.

As best seen in FIG. 45, the synthetic jet ejector 503 is equipped with a switch 521 set in an aperture 522 in the lower housing element 509. This switch 521 may be utilized to toggle the synthetic jet ejector 503 between an on and off state. As best seen in FIG. 44, a power port 523 equipped with a conductive element 525 is also provided on a surface of the lower housing element 509. The power port 523 accepts a complimentary-shaped plug which may be connected to a suitable power supply, preferably by way of a suitable voltage regulator.

Figure 46:
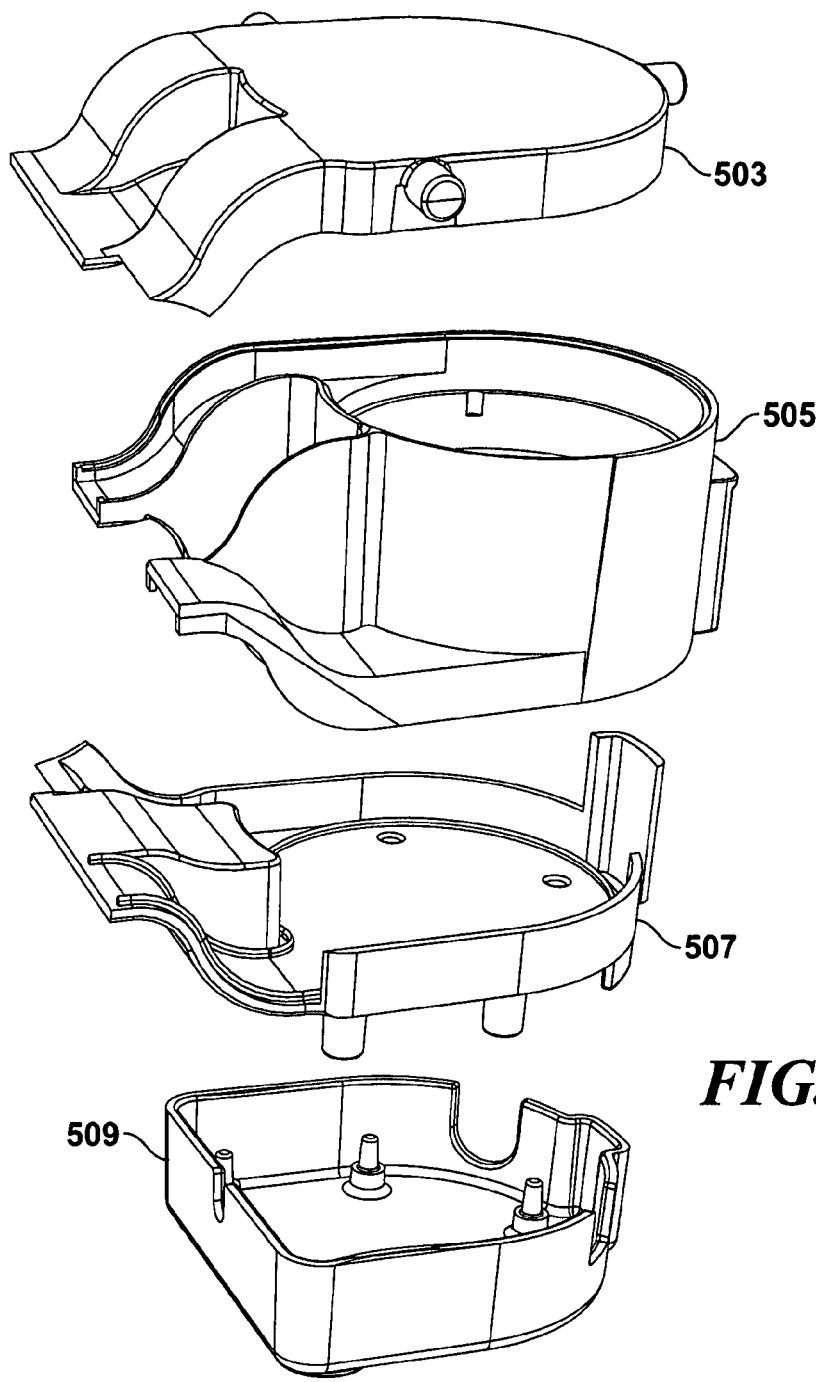
FIG. 46 is an exploded view of the housing assembly of the synthetic jet ejector of FIG. 41.
Figure 47:
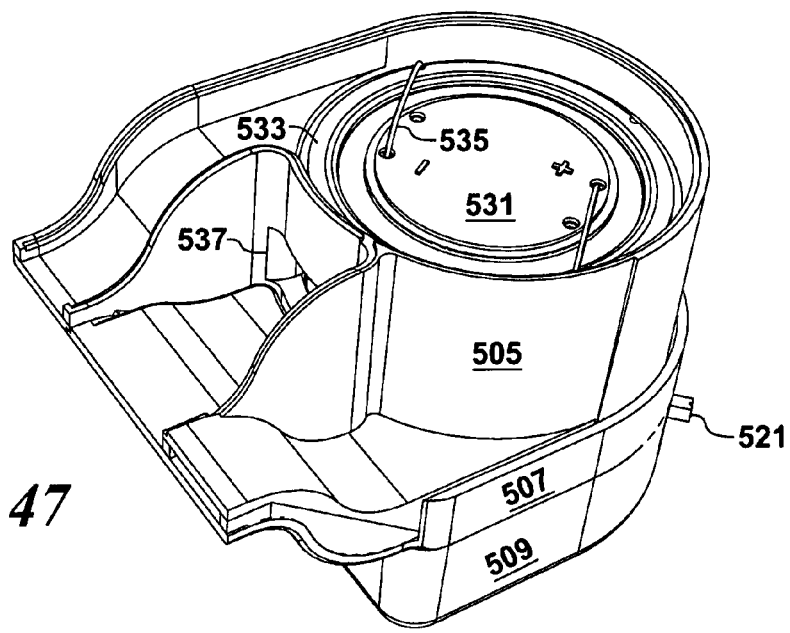
FIG. 47 is a perspective view of the synthetic jet ejector of FIG. 41 with the upper housing element removed.
Figure 48:
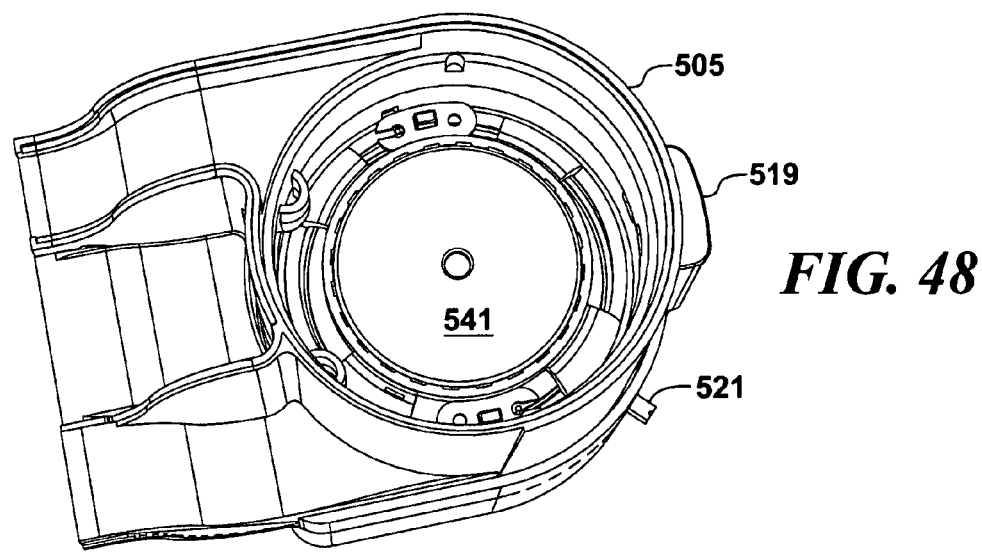
FIG. 48 is a perspective view of the synthetic jet ejector of FIG. 41 with the first synthetic jet actuator assembly removed.
Figure 49:
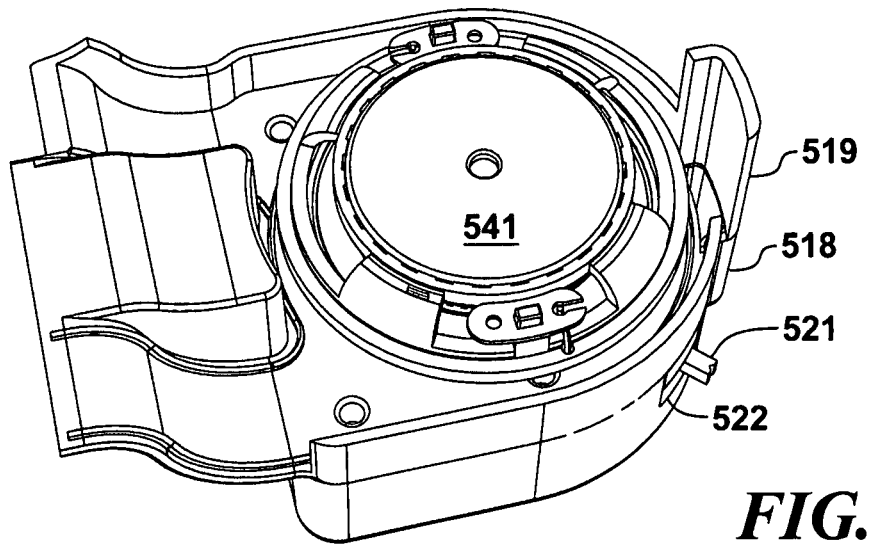
FIG. 49 is a perspective view of the synthetic jet ejector of FIG. 48 with the first middle housing element removed.
Figure 50:
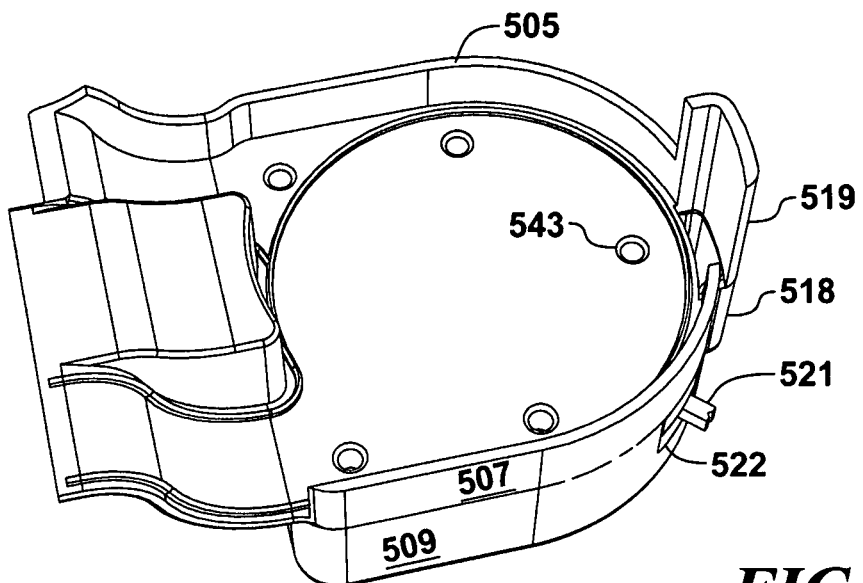
FIG. 50 is a perspective view of the synthetic jet ejector of FIG. 49 with the second synthetic jet actuator assembly removed.
Figure 51:
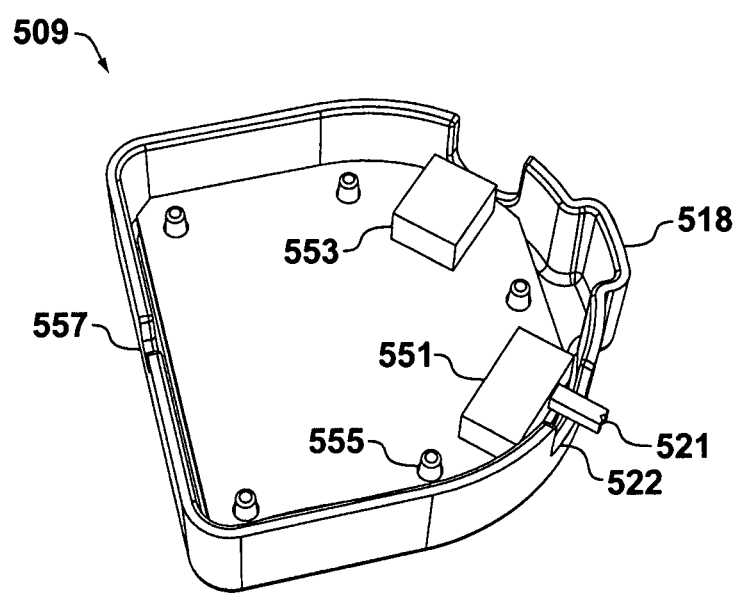
FIG. 51 is a perspective view of the synthetic jet ejector of FIG. 50 with the second middle housing element removed.

The means by which the upper housing element 503, first middle housing element 505, second middle housing element 507, and lower housing element 509 are assembled may be appreciated with respect to FIG. 46, which depicts the various housing elements, and with respect to FIGS. 55-62, which show the individual elements of the housing assembly in greater detail.

Figure 56:
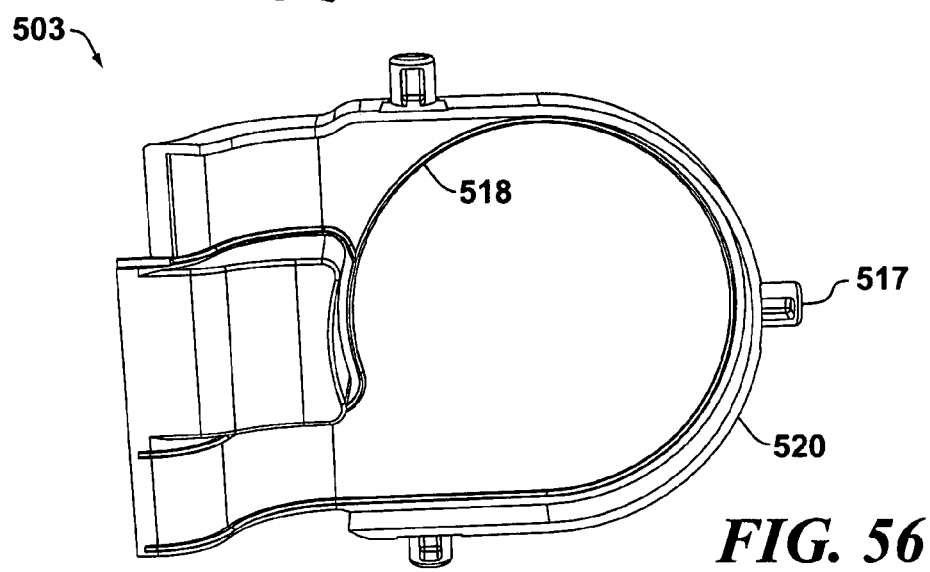
FIG. 56 is a perspective view of the upper housing element of the synthetic jet ejector of FIG. 41.
Figure 57:
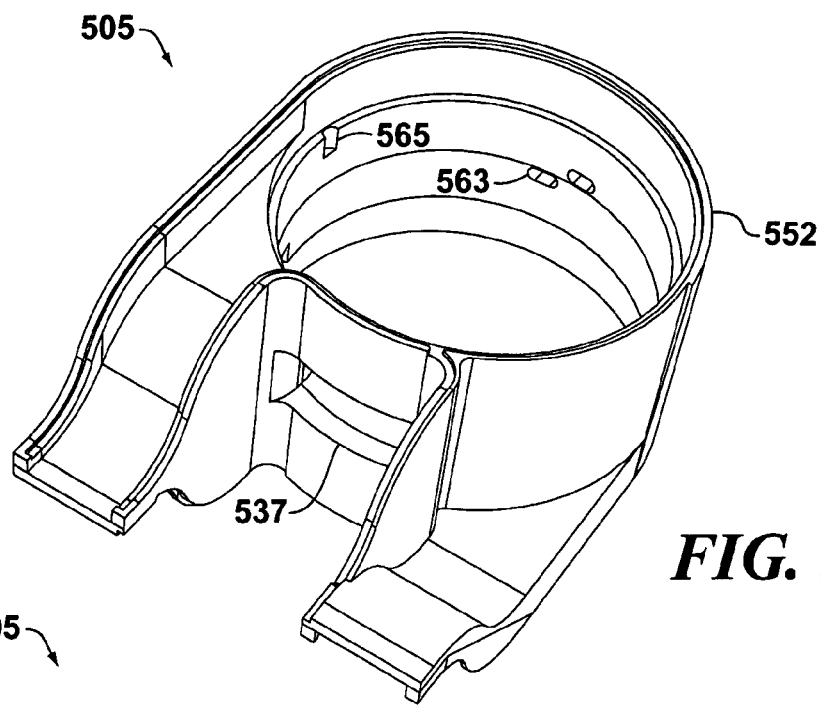
FIG. 57 is a perspective (bottom) view of the upper housing element of the synthetic jet ejector of FIG. 41.

As seen in FIG. 56, the interior surface of the upper housing element 503 is equipped with an interior ridge 518 and an exterior ridge 520. The interior ridge 518 is complimentary in shape to the upper lip 552 (see FIGS. 57-58) of the first middle housing element 505. Together, the interior ridge 518 and exterior ridge 520 releasably engage the upper lip 552 of the first middle housing element 505. The second middle housing element 507 is equipped with an interior ridge 526 and an exterior ridge 528 (see FIG. 59) which releasably engage a lower lip of the first middle housing element 505 in a similar manner. It will be appreciated, of course, that these surfaces may engage each other permanently (e.g., non-releasably) after application of an adhesive or after the structure has been subjected to ultrasonic welding or other such processes. It will further be appreciated that features 518, 520, 552, 526 and 528 may be adapted to serve as energy directors for ultrasonic welding, or as features which facilitate bonding or sealing of the housing elements with an adhesive or sealant.

Figure 59:
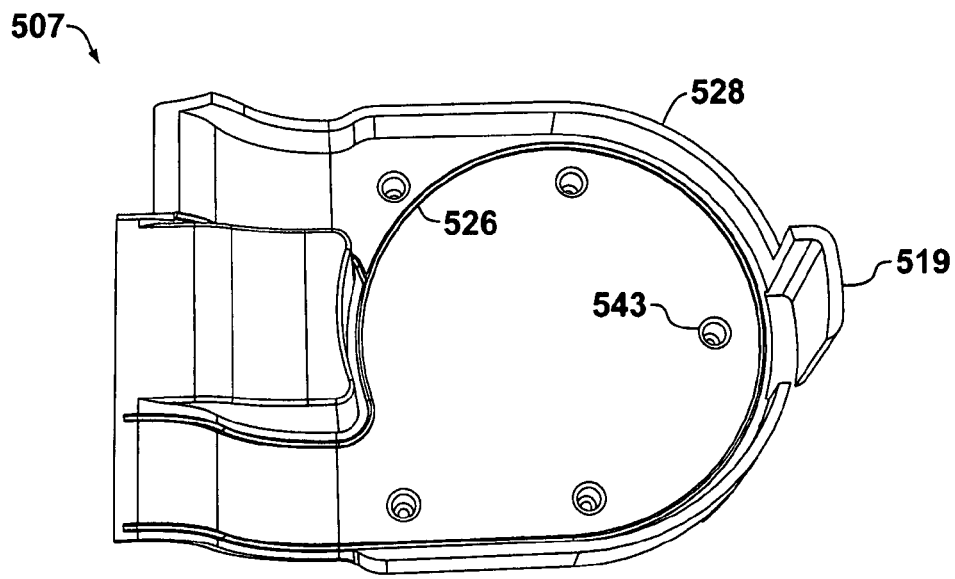
FIG. 59 is a perspective view of the first middle housing element of the Synthetic jet ejector of FIG. 41.
Figure 60:
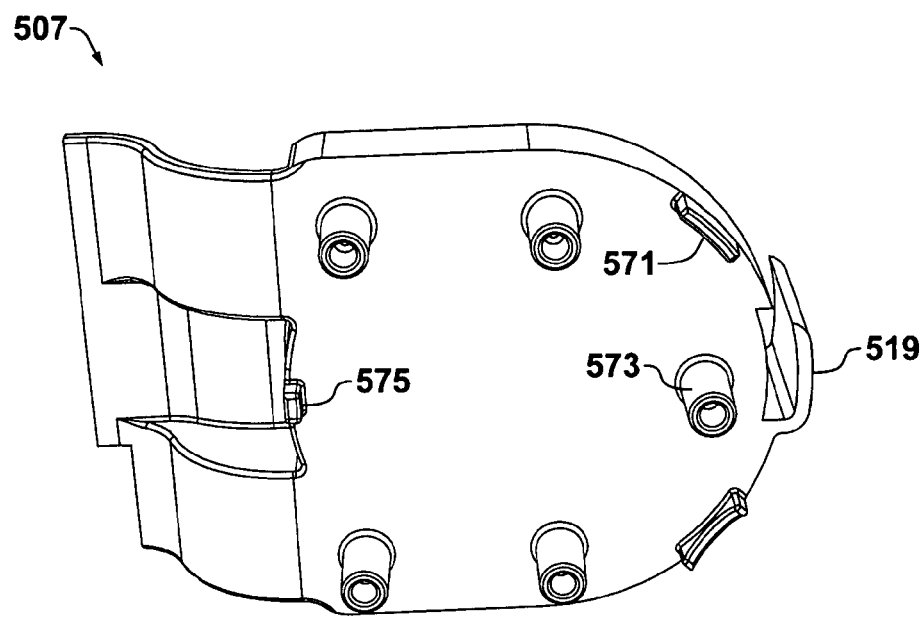
FIG. 60 is a perspective view of the second middle housing element of the synthetic jet ejector of FIG. 41.

Referring now to FIGS. 59-60, the second middle housing element 507 is provided with a plurality of hollow protrusions 573 on a lower surface thereof which releasably engage a series of pegs 581 (see FIG. 61) provided on a surface of the lower housing element 509. The upper surface of the second middle housing element 507 is provided with a series of apertures 543 which correspond to, and are in open communication with, the hollow protrusions 573. The second middle housing element 507 is also provided with a series of tabs 571 which extend into depressions provided on the exterior surface of the lower housing element 509 for the power port 523 and the switch 521, and a tab 575 which extends into a depression provided on the exterior surface of the lower housing element 509 for an LED indicator (not shown) which may be utilized to indicate when the synthetic jet ejector 501 has been turned on.

Figure 61:
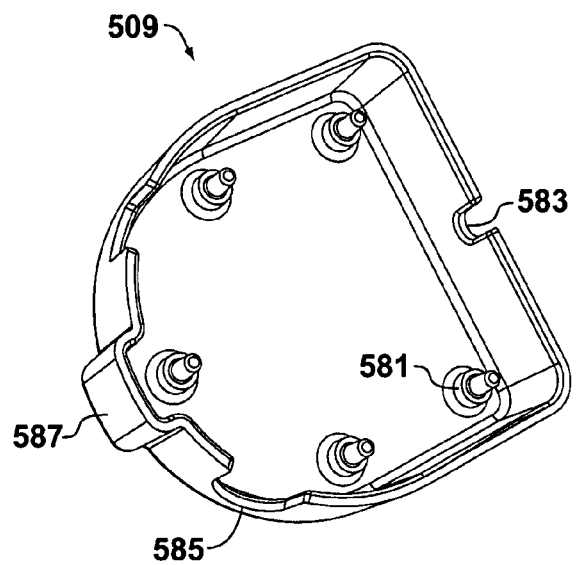
FIG. 61 is a perspective view of the second middle housing element of the synthetic jet ejector of FIG. 41.
Figure 62:
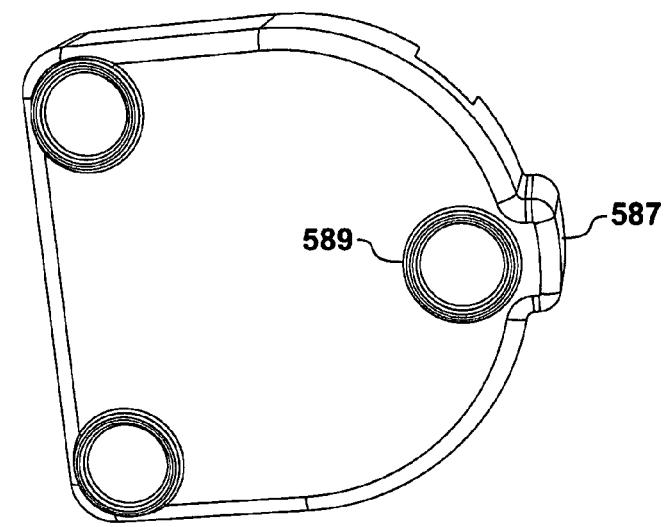
FIG. 62 is a perspective view of the lower housing element of the synthetic jet ejector of FIG. 41.

The lower housing element 509 is shown in detail in FIGS. 61-62. As seen therein, the lower housing element 509 is provided with a series of openings 585 to accommodate the switch 521 (see FIG. 45) and power port 523 (see FIG. 44), and an additional opening 583 to accommodate an LED indicator (not shown). The exterior surface of the lower housing element 509 is equipped with a series of elastomeric pads 589 which serve to dampen vibration, and which maintain the synthetic jet ejector 501 in a stationary position on a surface.

Figure 58:
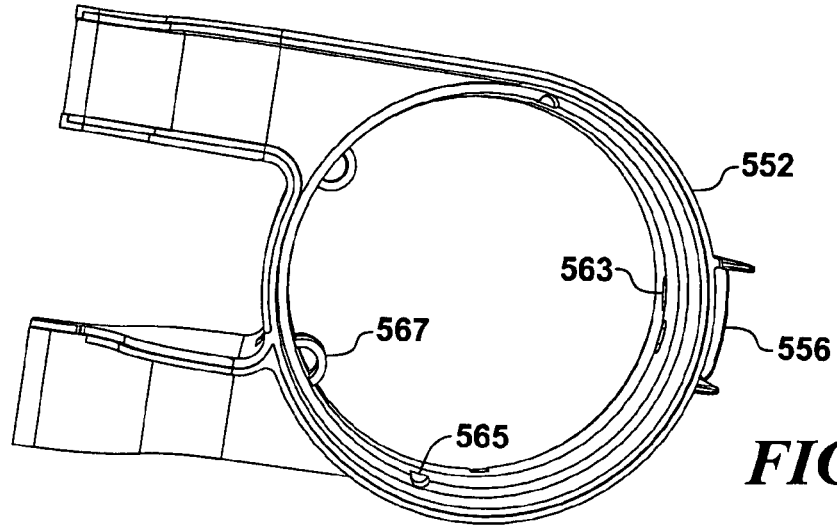
FIG. 58 is a perspective view of the first middle housing element of the Synthetic jet ejector of FIG. 41.

The lower housing element 509 is equipped with a protrusion 587 which aligns with a complimentary shaped protrusion 519 provided on the second middle housing element (see FIGS. 59-60), which in turn aligns with a protrusion 556 provided on the first middle housing element 505 (see FIG. 58). Protrusions 587, 519 and 556 thereby form a conduit through which wiring can be conveniently run between the various housing elements without interfering with any of the features internal to those elements.

Figure 52:
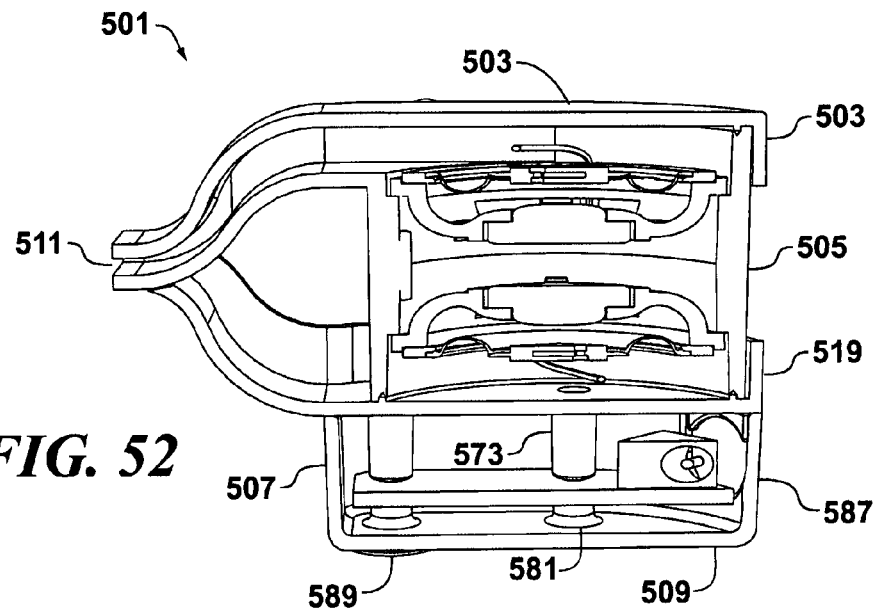
FIG. 52 is a cross-sectional view taken along LINE 52-52 of FIG. 41.
Figure 53:
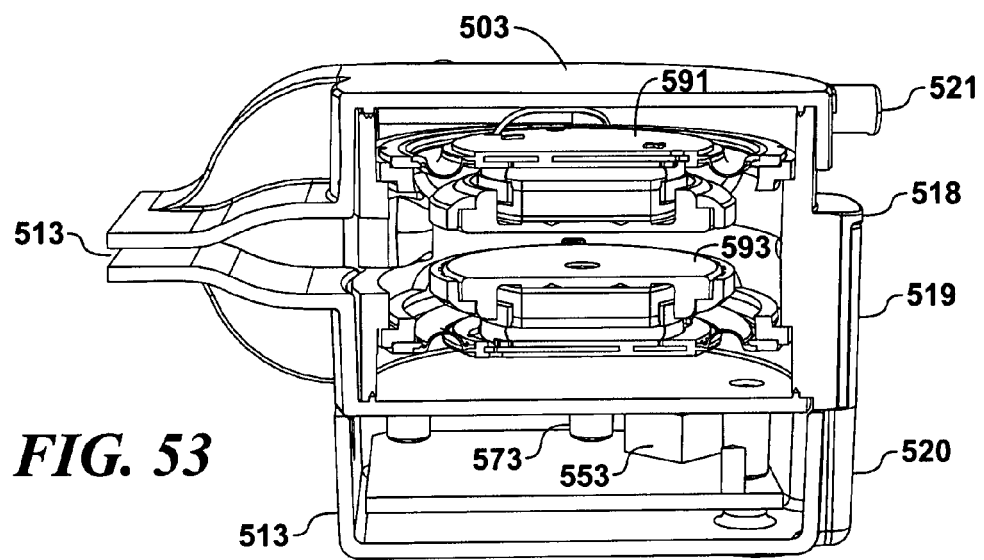
FIG. 53 is a cross-sectional view taken along LINE 53-53 of FIG. 41.
Figure 54:
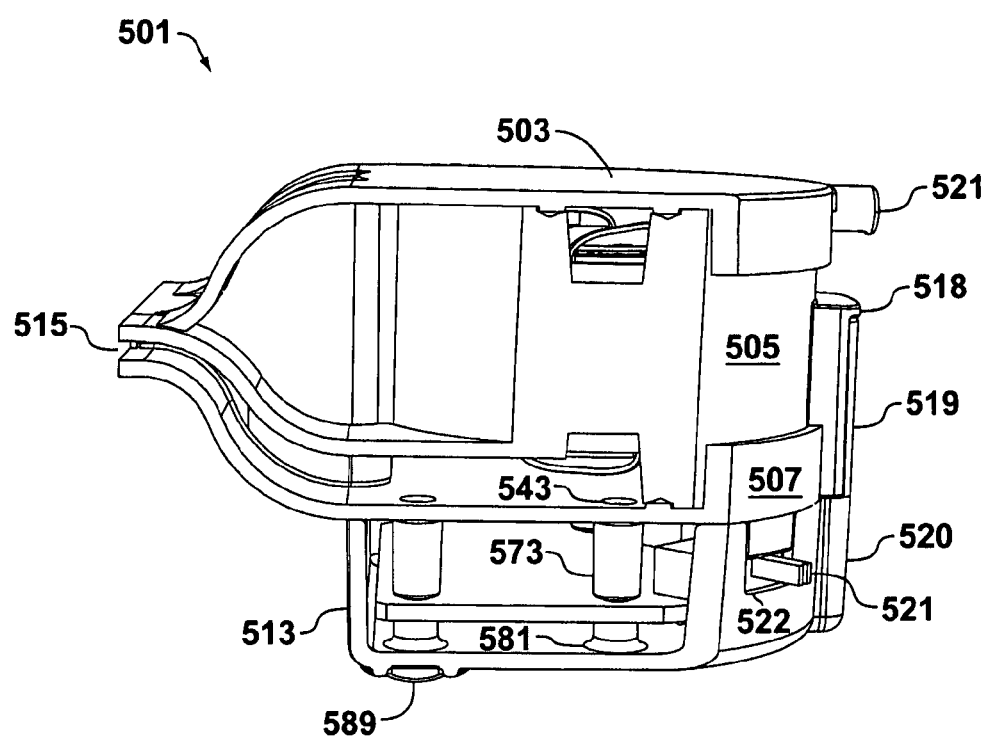
FIG. 54 is a cross-sectional view taken along LINE 53-53 of FIG. 41.
Figure 55:
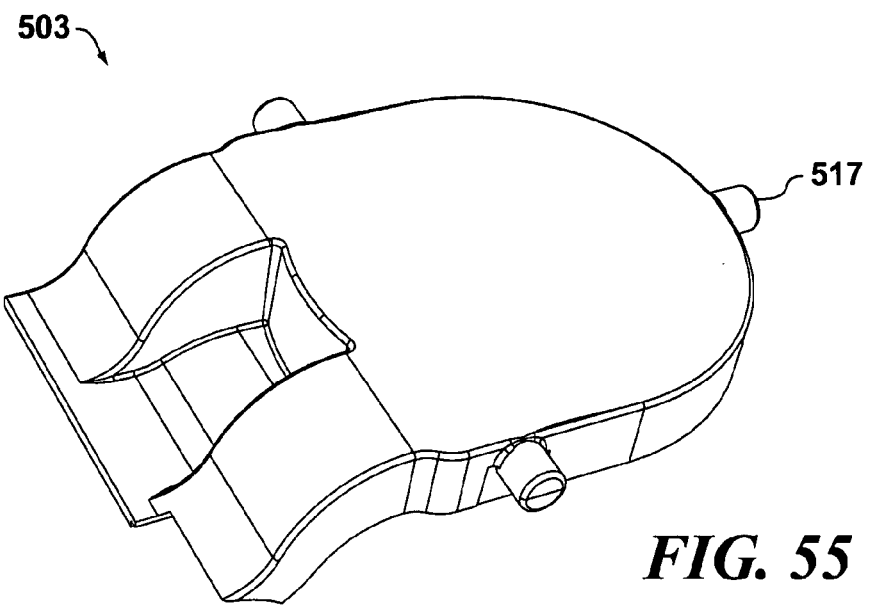
FIG. 55 is a perspective view of the upper housing element of the synthetic jet ejector of FIG. 41.

FIGS. 52-53 illustrate a further aspect of the synthetic jet ejector 501. As seen therein, the synthetic jet ejector 501 comprises first 591 and second 593 synthetic jet actuators, the diaphragms of which are aligned, respectively, with channels 511 and 513. As seen in FIG. 58, various features 563, 565 and 567 are provided on the interior surface of the first middle housing element 505 to properly support the first 591 and second 593 synthetic jet actuators.

The synthetic jet ejectors may operate independently of each other. In some embodiments, the first 591 and second 593 synthetic jet actuators may be operated out-of-phase and/or may have diaphragms of essentially equal mass to achieve vibration reduction. It will be appreciated that this approach may be used to create synthetic jet ejectors having almost any number of actuators.

It will be appreciated from the foregoing that one of the advantages of the devices and methodologies disclosed herein pertains to the moldability of the housing components of the synthetic jet ejector. Because the housing design is moldable, the synthetic jet ejectors described herein can be readily made in a reasonably small number of parts, which can then be assembled through the use of suitable adhesives, by thermal welding, or through other techniques to achieve the final device. This is so even if the housing components are complex in structure or have a high feature density. Such molding techniques permit substantial flexibility in the placement of synthetic jet actuators within the device, since suitable channels may be readily designed into the housing components to direct the synthetic jets to where they are needed and to impart a desired angular orientation to them. Moreover, the housing components may be provided with ridges, indentations, protrusions, apertures, and other such features which can be utilized to create a sturdy, air-tight seal between them.

A further advantage of the use of molding techniques is that the components of the synthetic jet ejectors may be provided with desired colors or tints through the use of appropriate pigments or dyes or, as the case may be, may be made transparent or translucent. Thus, for example, portions of the housings of the synthetic jet ejectors described herein may be made transparent so that components of the device are visible, thus facilitating maintenance or testing. The components of the housing assembly may also be color coordinated to facilitate assembly.

A variety of molding techniques as are known to the art may be used to form the housing assemblies described herein, and the components thereof. These include, without limitation, blow molding (including extrusion blow molding, injection blow molding, and stretch blow molding), injection molding, compression molding, extrusion molding, rotational molding, and various combinations of the foregoing. Other processes, such as calendaring, vulcanization, annealing, cross-linking, UV curing, or thermal curing, may be used in conjunction with, or as an element of, these processes.

Figure 5:
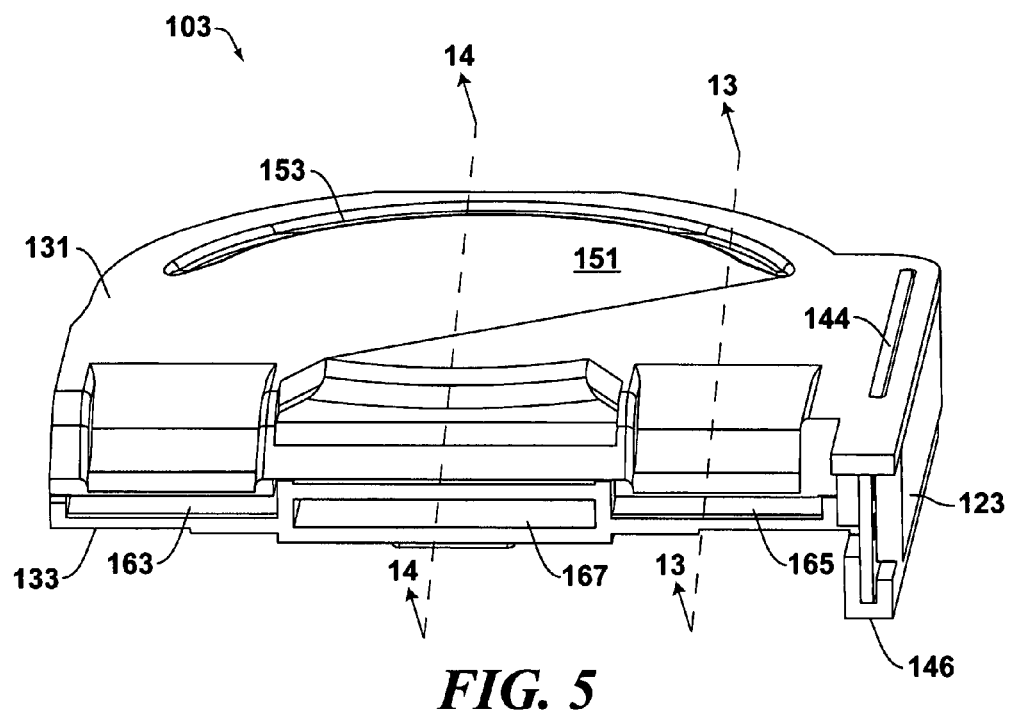
FIG. 5 is a perspective view of the synthetic jet ejector used in the thermal management system of FIG. 1.
Figure 6:
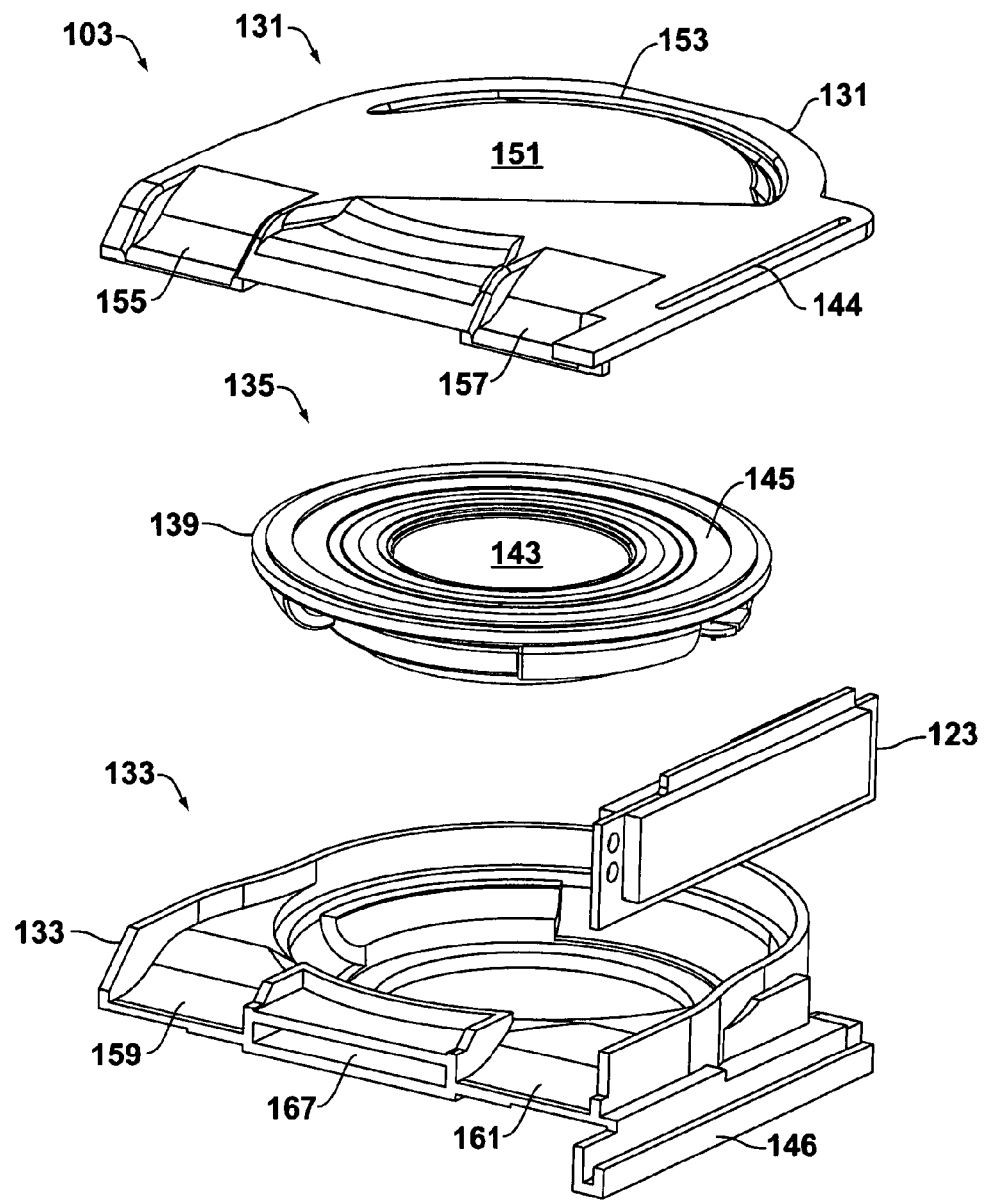
FIG. 6 is an exploded view of the synthetic jet ejector of FIG. 5.
Figure 7:
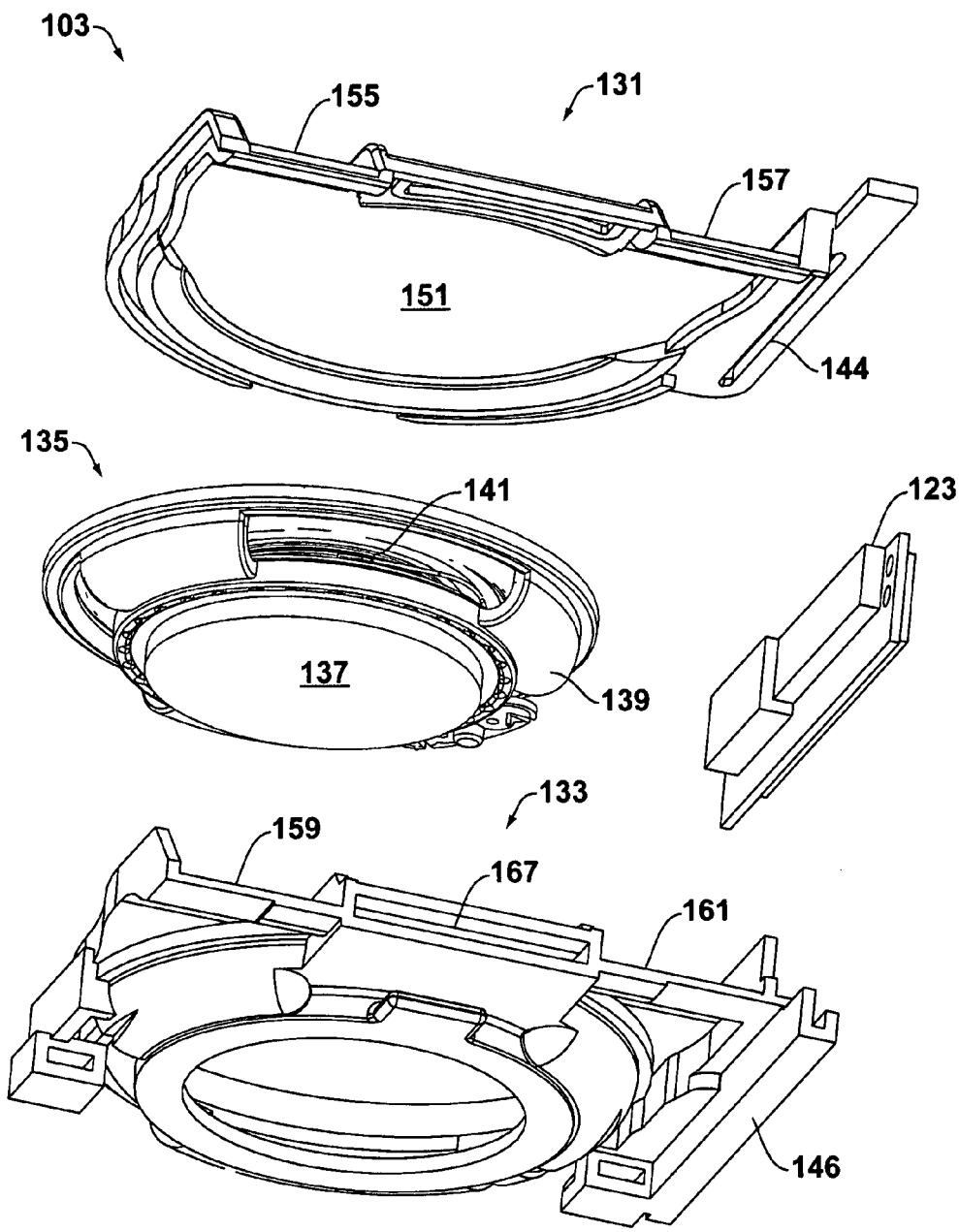
FIG. 7 is an exploded view of the synthetic jet ejector of FIG. 5.
Figure 8:
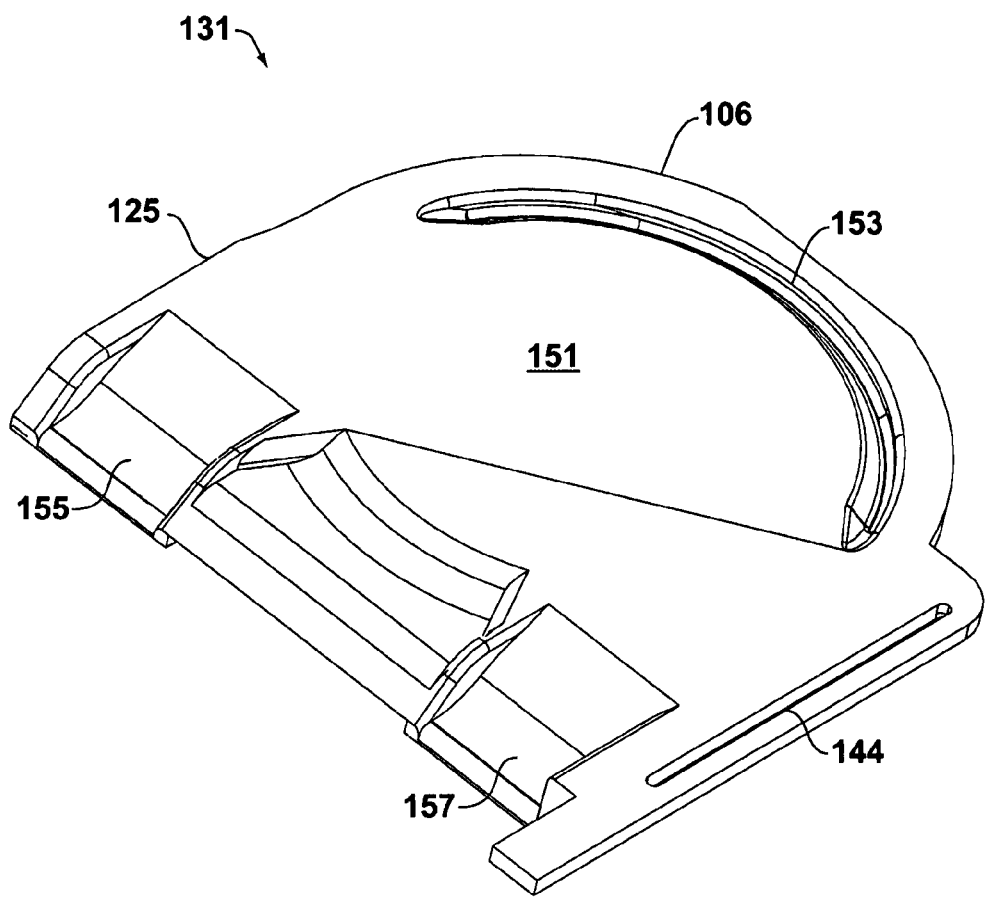
FIG. 8 is a perspective view of the upper housing element of the synthetic jet ejector of FIG. 5.
Figure 9:
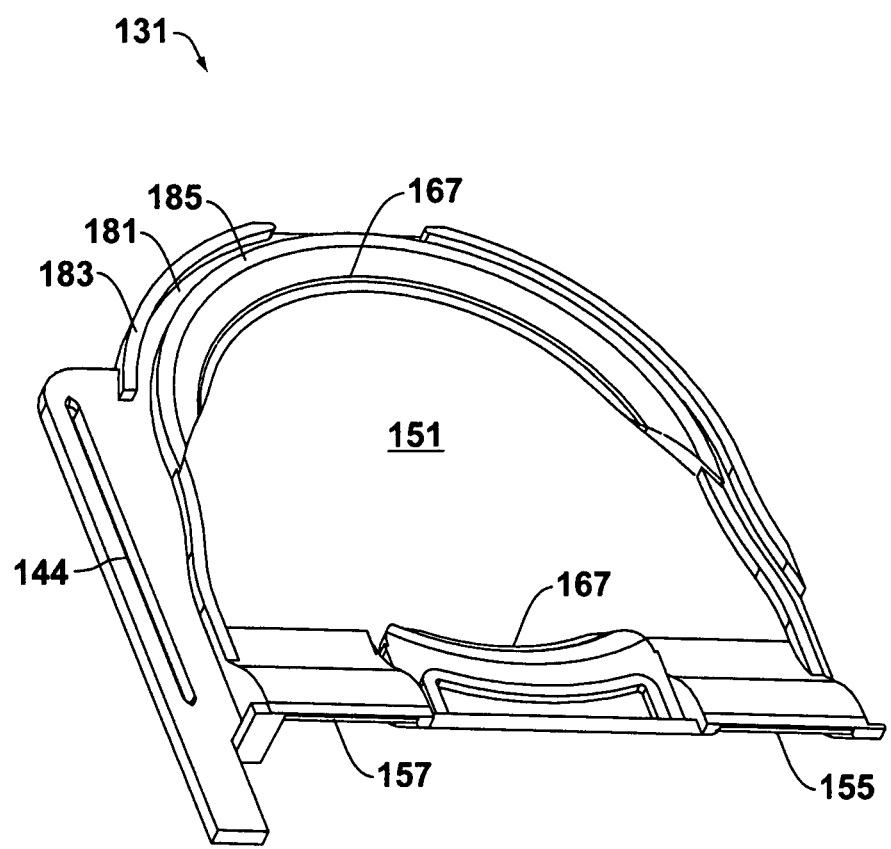
FIG. 9 is a perspective view of the upper housing element of the synthetic jet ejector of FIG. 5.

As a specific, non-limiting example of how a housing assembly may be manufactured in accordance with the teachings herein, injection molding may be utilized to fabricate the components of the housing assembly (such as the top 131 and bottom 133 portions depicted in FIGS. 5-6). If the housing is constructed out of a thermoplastic material such as ABS (acrylonitrile butadiene styrene) or nylon, the thermoplastic material is typically provided in pellet form and is melted by heat and shearing forces shortly before use. The molten thermoplastic is then injected at high pressure into a mold, which is the inverse of the desired shape of the component being molded. The mold is typically made from a suitable metal such as hardened steel or aluminum, and is precision machined to form the features of the desired part. After the thermoplastic has cooled to a suitable temperature, the mold is separated to permit the molded component to be extracted.

A variety of materials may be used in the fabrication of synthetic jet ejector housing assemblies in accordance with the teachings herein. Such materials include, without limitation, various polymeric materials, including both thermoplastic and thermosetting materials, as well as various metals and metal alloys. Various additives may be employed with these materials, including dyes, pigments, coatings, plasticizers, fillers, UV stabilizers, cross-linking agents, modifiers, surfactants, and the like.

Various polymeric materials may be utilized in the housing assemblies described herein. These include, but are not limited to, acrylonitrile butadiene styrene (ABS), acrylic polymers, celluloid, cellulose acetate, ethylene-vinyl acetate (EVA), ethylene vinyl alcohol (EVAL), fluoroplastics (including PTFEs such as FEP, PFA, CTFE, ECTFE, and ETFE), ionomeric materials, liquid crystal polymers (LCP), polyacetals (POM or acetal), polyacrylates, polyacrylonitrile, polyamides (PA), polyamide-imide (PAI), polyaryletherketones (PAEK), polybutadiene (PBD), polybutylene (PB), polybutylene terephthalate (PBT), polyethylene terephthalate (PET), polycyclohexylene dimethylene terephthalate (PCT), polycarbonates (PC), polyketones (PK), polyesters, polyethylene, polyethylene/polythene/polyethene, polyetheretherketones (PEEK), polyetherimides (PEI), polyethersulfones (PES) and polysulfones, nylon, polyethylenechlorinates (PEC), polyimides (PI), polylactic acids (PLA), polymethylpentene (PMP), polyphenylene oxide (PPO), polyphenylene sulfide (PPS), polyphthalamide (PPA), polypropylene (PP), polystyrene (PS) (including syndiotactic and atactic polystyrene), polysulfones (PSU), polyvinyl chloride (PVC), vulcanized rubbers, melamine, urea-formaldehyde resins, phenol-formaldehyde resins, polyesters, nylon, and epoxy resins. Likewise, various metals and metal alloys may be utilized in the housing assemblies described herein. These include, without limitation, aluminum, copper, tin, magnesium, zinc and various alloys of the foregoing.

It will further be appreciated that the housing assemblies may be fabricated from semiconductor and/or dielectric materials. Thus, for example, in some embodiments, synthetic jet ejectors may be formed directly on, or machined onto or into, die or other semiconductor wafers or substrates (including bulk and SOI (semiconductor on insulator) substrates) using fabrication techniques that are well known in the semiconductor arts and in the fabrication of MEMS devices. Such fabrication techniques may include, for example, steps that involve deposition, etching (including dry etching and wet etching), masking, oxidation, epitaxial growth, and the like.

Various means of forming an electrical contact between the synthetic jet actuator disposed in the synthetic jet actuator housing and any external wires or circuitry used to power or control the device may also be employed. Preferably, this is accomplished by providing an aperture in one portion of the housing which may be sealed with an adhesive or sealant as described above after the wiring or circuitry for the actuator is in place. However, in other embodiments, one or more metal contact plates or busses may be provided in a wall of the housing which makes electrical contact with the synthetic jet actuator when it is positioned within the housing, as through electrically conductive compressive springs or by other means. Such plates or busses may be designed to snap into apertures or indentations provided in the housing, preferably in such a way that an airtight seal around the plates or busses is attained. In other embodiments, one or more clamping mechanisms may be provided which apply a compressive force to the wires or circuitry, possibly with a resilient or elastomeric member, thereby achieving an airtight seal.

Several variations are possible in the devices and methodologies disclosed herein. For example, in some embodiments, the synthetic jet ejector housing may be formed from a single molded piece. As a particular, non-limiting example of such a variation, the single molded piece may be formed with first and second portions that correspond, respectively, to the upper and lower portions of the housing, and which are separated across a foldable seam. The foldable seam may be formed, for example, by thinning or perforating the housing material along an axis. The first portion may then be folded over the second portion about the axis to form the housing assembly. Releasable fasteners may be provided to hold the housing assembly together and, in some embodiments, may be built into the upper or lower portions of the housing.

In some embodiments of the housing assemblies described herein, an elastomeric gasket may be provided along adjoining surfaces of the first and second portions. In such embodiments, the first and second portions may be adjoined with compressive force to form an airtight seal between them.

In other embodiments, the housing assembly may be formed as a single molded portion which may be adjoined to a surface or substrate to complete the housing assembly. For example, the molded portion may be glued or bonded to a PCB, die, chassis, or other such surface to form a completed housing in which the surface or substrate forms a wall of the housing.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a synthetic jet ejector, comprising:
   molding first and second synthetic jet housing portions out of a moldable material; and
   encasing a synthetic jet actuator in a housing formed by said first and second housing portions;
   wherein said housing contains at least one aperture adapted to emit a synthetic jet, wherein said first and second housing portions form first and second portions of a channel which is in open communication with said synthetic jet actuator and said aperture, and wherein said channel has a sloped surface.

2. The method of claim 1, wherein said housing is formed by joining said first and second housing portions along a seam.

3. The method of claim 2, wherein said seam is formed from first and second abutting surfaces disposed, respectfully, on said first and second housing portions.

4. The method of claim 3, further comprising the step of applying a portion of adhesive between said first and second abutting surfaces.

5. The method of claim 3, further comprising the step of applying an elastomer between said first and second abutting surfaces.

6. The method of claim 1, wherein the first and second synthetic jet housing portions are made by injection molding.

7. The method of claim 1, wherein the first and second housing portions are joined together, and wherein the synthetic jet actuator is encased in the synthetic jet housing by folding the first and second housing portions together about an axis.

8. The method of claim 1, wherein the first housing portion has at least one protrusion which engages an indentation in the second housing portion.

9. The method of claim 8, wherein the at least one protrusion is a ridge.

10. The method of claim 9, wherein the ridge is disposed about the perimeter of the first housing portion.

11. The method of claim 9, wherein the ridge is dipped in an adhesive before it is coupled to the indentation.

12. The method of claim 9, wherein the top of the ridge is coated with an elastomer before it is coupled to the indentation.

13. The method of claim 1, wherein said at least one aperture is a nozzle.

14. The method of claim 1, wherein said first and second housing portions form first and second portions of first and second channels, wherein said first channel is in open communication with a first aperture and a first space above said synthetic jet actuator, and wherein said second channel is in open communication with a second aperture and a second space below said synthetic jet actuator.

15. The method of claim 14, wherein said synthetic jet actuator is equipped with a diaphragm, wherein said first space is immediately above said diaphragm, and wherein said second space is immediately below said diaphragm.

16. The method of claim 1, wherein said first and second housing portions form first and second portions of a wire conduit which is in open communication with each of said first and second housing portions.

17. The method of claim 1, wherein said synthetic jet ejector comprises first and second synthetic jet actuators, wherein said first and second housing portions form first and second portions of first and second channels, wherein said first channel is in open communication with a first aperture and a first space adjacent to said first synthetic jet actuator, and wherein said second channel is in open communication with a second aperture and a second space adjacent to said second synthetic jet actuator.

18. The method of claim 17, wherein said first synthetic jet actuator is equipped with a first diaphragm, wherein said second synthetic jet actuator is equipped with a second diaphragm, wherein said first space is adjacent to said first diaphragm, and wherein said second space is adjacent to said second diaphragm.

19. A synthetic jet ejector, comprising:
   a first housing portion; and
   a second housing portion which releasably attaches to said first housing portion;
   wherein said first and second housing portions form first and second portions, of a passageway adapted to emit at least one synthetic jet;

wherein said synthetic jet ejector comprises first and second synthetic jet actuators, wherein said first and second housing portions form first and second portions of first and second channels, wherein said first channel is in open communication with a first aperture and a first space adjacent to said first synthetic jet actuator, and wherein said second channel is in open communication with a second aperture and a second space adjacent to said second synthetic jet actuator.

20. The synthetic jet ejector of claim 19, wherein said second housing portion releasably attaches to said first housing portion to form an airtight seam between them.

21. The synthetic jet ejector of claim 19, wherein at least one of said first and second synthetic jet actuators is adapted to be encased in a housing formed from said first and second housing portions.

22. The synthetic jet ejector of claim 21, wherein at least one of said first and second housing portions comprises keying features which ensure the proper orientation of at least one of said first and second synthetic jet actuators within the housing.

23. The synthetic jet ejector of claim 21, wherein said synthetic jet ejector comprises a basket formed by said second housing portion.

24. The synthetic jet ejector of claim 19, wherein said first and second housing portions form first and second portions of first and second channels, wherein said first channel is in open communication with a first aperture and a first space above said first synthetic jet actuator, and wherein said second channel is in open communication with a second aperture and a second space below said first synthetic jet actuator.

25. The synthetic jet ejector of claim 24, wherein said first synthetic jet actuator is equipped with a diaphragm, wherein said first space is immediately above said diaphragm, and wherein said second space is immediately below said diaphragm.

26. The synthetic jet ejector of claim 19, wherein said first synthetic jet actuator is equipped with a first diaphragm, wherein said second synthetic jet actuator is equipped with a second diaphragm, wherein said first space is adjacent to said first diaphragm, and wherein said second space is adjacent to said second diaphragm.

27. The synthetic jet ejector of claim 19, wherein said first and second housing portions are joined along a seam formed by first and second abutting surfaces disposed, respectfully, on said first and second housing portions.

28. The synthetic jet ejector of claim 27, further comprising an elastomer disposed between said first and second abutting surfaces.

29. The synthetic jet ejector of claim 27, wherein the first housing portion has at least one ridge disposed about its perimeter which engages an indentation in the second housing portion.

30. The synthetic jet ejector of claim 19, wherein said first aperture is a nozzle.

31. The synthetic jet ejector of claim 19, wherein said first and second housing portions form first and second portions of a wire conduit which is in open communication with each of said first and second housing portions.

32. A method for making a synthetic jet ejector, comprising:
providing first and second synthetic jet housing portions comprising a molded material; and
encasing first and second synthetic jet actuators in a housing formed by said first and second housing portions;
wherein said first and second housing portions form first and second portions of a first channel and said first and second housing portions form first and second portions of a second channel, wherein said first channel is in open communication with a first aperture and a first space adjacent to said first synthetic jet actuator, and wherein said first channel is in open communication with a second aperture and a second space adjacent to said second synthetic jet actuator, and wherein said first and second apertures are adapted to emit synthetic jets.

33. The method of claim 32, wherein said first synthetic jet actuator is equipped with a first diaphragm, wherein said second synthetic jet actuator is equipped with a second diaphragm, wherein said first space is adjacent to said first diaphragm, and wherein said second space is adjacent to said second diaphragm.

34. The method of claim 33, wherein said molded material is a plastic.

* * * * *